(12) United States Patent
Son et al.

(10) Patent No.: US 10,109,642 B2
(45) Date of Patent: Oct. 23, 2018

(54) VERTICAL-TYPE SEMICONDUCTOR DEVICES AND METHODS OF MANUFACTURING THE SAME

(71) Applicant: Samsung Electronics Co., Ltd., Suwon-si (KR)

(72) Inventors: Yong-Hoon Son, Yongin-si (KR); Jong-Wook Lee, Yongin-si (KR); Jong-Hyuk Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/275,972

(22) Filed: Sep. 26, 2016

(65) Prior Publication Data

US 2017/0012054 A1   Jan. 12, 2017

Related U.S. Application Data

(63) Continuation of application No. 14/723,644, filed on May 28, 2015, now Pat. No. 9,496,277, which is a
(Continued)

(30) Foreign Application Priority Data

Feb. 29, 2008  (KR) ................ 10-2008-0018980
Sep. 30, 2008  (KR) ................ 10-2008-0096030

(51) Int. Cl.
*H01L 27/11582* (2017.01)
*H01L 27/11578* (2017.01)
(Continued)

(52) U.S. Cl.
CPC .. *H01L 27/11582* (2013.01); *H01L 21/02524* (2013.01); *H01L 21/02587* (2013.01);
(Continued)

(58) Field of Classification Search
CPC .......... H01L 27/1052; H01L 27/11556; H01L 27/1158; H01L 27/11582; H01L 27/11521; H01L 29/66787; H01L 29/66833
See application file for complete search history.

(56) References Cited

U.S. PATENT DOCUMENTS 6,027,975 A * 2/2000 Hergenrother ........ H01L 29/161
                                                257/E21.41
7,005,350 B2   2/2006 Walker et al.
(Continued)

FOREIGN PATENT DOCUMENTS

JP    2007180389    7/2007
KR    100739989     7/2007

OTHER PUBLICATIONS

"Vertical-Type Semiconductor Devices and Methods of Manufacturing the Same", Specification, Drawings, Claims and Prosection History, of U.S. Appl. No. 13/271,446, filed Oct. 12, 2011 by Yong-Hoon Son, et al.
(Continued)

*Primary Examiner* — Timor Karimy
(74) *Attorney, Agent, or Firm* — Myers Bigel, P.A.

(57) ABSTRACT

In a vertical-type memory device and a method of manufacturing the vertical-type memory device, the vertical memory device includes an insulation layer pattern of a linear shape provided on a substrate, pillar-shaped single-crystalline semiconductor patterns provided on both sidewalls of the insulation layer pattern and transistors provided on a sidewall of each of the single-crystalline semiconductor patterns. The transistors are arranged in a vertical direction of the single-crystalline semiconductor pattern, and thus the memory device may be highly integrated.

16 Claims, 23 Drawing Sheets

Related U.S. Application Data continuation of application No. 14/083,971, filed on Nov. 19, 2013, now Pat. No. 9,070,581, which is a continuation of application No. 13/673,396, filed on Nov. 9, 2012, now Pat. No. 8,603,878, which is a continuation of application No. 13/271,446, filed on Oct. 12, 2011, now Pat. No. 8,309,417, which is a continuation of application No. 12/380,565, filed on Feb. 27, 2009, now Pat. No. 8,063,438.

(51) Int. Cl.

| | | |
|---|---|---|
| *H01L 29/66* | (2006.01) | |
| *H01L 29/792* | (2006.01) | |
| *H01L 27/105* | (2006.01) | |
| *H01L 21/02* | (2006.01) | |
| *H01L 21/28* | (2006.01) | |
| *H01L 21/285* | (2006.01) | |
| *H01L 21/306* | (2006.01) | |
| *H01L 21/3213* | (2006.01) | |
| *H01L 27/11568* | (2017.01) | |
| *H01L 29/423* | (2006.01) | |
| *H01L 29/45* | (2006.01) | |
| *H01L 27/1158* | (2017.01) | |

(52) U.S. Cl.
CPC .. *H01L 21/02598* (2013.01); *H01L 21/02675* (2013.01); *H01L 21/28282* (2013.01); *H01L 21/28518* (2013.01); *H01L 21/30604* (2013.01); *H01L 21/32133* (2013.01); *H01L 27/1052* (2013.01); *H01L 27/11568* (2013.01); *H01L 27/11578* (2013.01); *H01L 29/4234* (2013.01); *H01L 29/45* (2013.01); *H01L 29/665* (2013.01); *H01L 29/66666* (2013.01); *H01L 29/66787* (2013.01); *H01L 29/66833* (2013.01); *H01L 29/792* (2013.01); *H01L 29/7926* (2013.01); *H01L 27/1158* (2013.01)

(56) References Cited

U.S. PATENT DOCUMENTS

| | | |
|---|---|---|
| 9,070,581 B2 | 6/2015 | Son et al. |
| 2001/0019142 A1 | 9/2001 | Nakahata et al. |
| 2004/0070007 A1* | 4/2004 | Zhang ............... H01L 29/66545 257/200 |
| 2007/0158736 A1 | 7/2007 | Arai et al. |
| 2007/0167012 A1 | 7/2007 | Tanaka |
| 2007/0272956 A1 | 11/2007 | Kurachi et al. |
| 2008/0029811 A1* | 2/2008 | Yun ..................... H01L 29/0653 257/330 |
| 2008/0173928 A1 | 7/2008 | Arai et al. |
| 2008/0179659 A1 | 7/2008 | Enda et al. |
| 2009/0180324 A1 | 7/2009 | Ramaswarmy et al. |

OTHER PUBLICATIONS

"Vertical-Type Semiconductor Devices and Methods of Manufacturing the Same", Specification, Drawings, Claims and Prosection History, of U.S. Appl. No. 12/380,565, filed Feb. 27, 2009 by Yong-Hoon Son, et al.

"Vertical-Type Semiconductor Devices and Methods of Manufacturing the Same", Specification, Drawings, Claims and Prosection History, of U.S. Appl. No. 13/673,396, filed Nov. 9, 2012 by Yong-Hoon Son, et al.

"Vertical-Type Semiconductor Devices and Methods of Manufacturing the Same", Specification, Drawings, Claims and Prosection History, of U.S. Appl. No. 14/083,971, filed Nov. 19, 2013 by Yong-Hoon Son, et al.

"Vertical-Type Semiconductor Devices and Methods of Manufacturing the Same", Specification, Drawings, Claims and Prosection History, of U.S. Appl. No. 14/743,644, filed May 28, 2015 by Yong-Hoon Son, et al.

* cited by examiner

VERTICAL-TYPE SEMICONDUCTOR DEVICES AND METHODS OF MANUFACTURING THE SAME

RELATED APPLICATIONS

This application is a continuation application of U.S. patent application Ser. No. 14/723,644, filed on May 28, 2015, which is a continuation application of U.S. patent application Ser. No. 14/083,971, filed on Nov. 19, 2013, which is a continuation application of U.S. patent application Ser. No. 13/673,396, filed on Nov. 9, 2012, which is a continuation application of U.S. patent application Ser. No. 13/271,446, filed on Oct. 12, 2011, now U.S. Pat. No. 8,309,417 issued Nov. 13, 2012, which is a continuation application of U.S. patent application Ser. No. 12/380,565 filed on Feb. 27, 2009, now U.S. Pat. No. 8,063,438 issued Nov. 22, 2011, which claims the benefit of Korean patent application numbers 10-2008-0018980 filed on Feb. 29, 2008 and 10-2008-0096030 filed on Sep. 30, 2008, in the Korean Intellectual Property Office, the contents of which applications are incorporated herein in their entirety by reference.

BACKGROUND

1. Field

Example embodiments relate to vertical-type semiconductor devices and methods of manufacturing the same. More particularly, example embodiments relate to semiconductor devices including cells that are connected vertically to one another and a method of manufacturing the same.

2. Description of the Related Art

Semiconductor memory devices can be categorized generally as volatile memory devices, e.g., dynamic random access memory (DRAM) or static random access memory (SRAM), and non-volatile memory devices, e.g., flash memory devices. The degrees of integration, operating speeds and capacitances of the semiconductor memory devices have been greatly improved due to expanding application fields thereof.

From a circuit point of view, a flash memory device of the non-volatile memory devices may be classified as either a NAND-type flash memory device or a NOR-type flash memory device. In the NAND-type flash memory device, unit strings including N transistors connected in series to one another may be connected in parallel between a bit line and a ground line. In the NOR-type flash memory device, each cell transistor may be connected in parallel between the bit line and the ground line.

Contemporary flash memory device are required to store a large amount of data. Thus, a plurality of the cell transistors may be required to be formed in a unit chip. However, further integration of such devices is limited by the substrate dimensions.

Recently, in order to improve the degrees of integration of memory devices, a method of forming cell transistors included in each unit chip in a vertical direction relative to the substrate has been researched. In particular, in the NAND-type flash memory device, the cell transistors can be stacked in a vertical direction to form a cell string, to thereby improve the degree of integration of a memory device.

However, when the cell transistors included in the flash memory device are formed to be stacked vertically, uniformity between operating characteristics of each of the cell transistors positioned in the vertical direction and operating characteristics of each of the cell transistors formed on the substrate is difficult to achieve. In particular, when a channel region of the cell transistor is formed using polysilicon, cell distribution characteristics of the cell transistor including polysilicon may be poor and the operating speed thereof may be decreased due to the reduction of cell current, as compared with the cell transistor including a channel region formed in the semiconductor substrate. Further, the durability of a tunnel oxide layer included in the cell transistor including polysilicon may be lowered, to thereby reduce reliability of the NAND flash memory device.

Further, when an opening is formed, in order to form a channel pattern of a pillar shape, the opening may have a sidewall inclination angle with respect to the substrate. Since the width of an upper portion of the opening needs to be increased due to the sidewall inclination, the width of the opening may not be reduced to a critical dimension level, and thus it may be difficult to highly integrate the memory device.

For these and other reasons, it is difficult to manufacture a non-volatile memory device including the cell transistors stacked in the vertical direction, to have high performance and high integration, and with high reliability.

SUMMARY

Example embodiments provide highly integrated vertical-type semiconductor devices with high performance.

Example embodiments provide methods of manufacturing the vertical-type semiconductor devices.

Example embodiments provide highly integrated vertical-type non-volatile memory devices with high performance.

Example embodiments provide methods of manufacturing the vertical-type non-volatile memory devices.

According to some example embodiments, in a vertical-type semiconductor device, an insulation layer pattern is provided on a substrate, the insulation layer pattern having a linear shape that extends in a first direction on the substrate. Single-crystalline semiconductor patterns are provided on the substrate to make contact with first and second sidewalls of the insulation layer pattern, the single-crystalline semiconductor patterns having a pillar shape that extends in a vertical direction relative to the substrate. Transistors are provided on a sidewall of each of the single-crystalline semiconductor patterns, the transistors being stacked in a vertical direction relative to the substrate.

In an example embodiment, the transistor may include a tunnel oxide layer, a charge-trapping layer, a blocking dielectric layer and a control gate pattern formed on the sidewall of the single-crystalline semiconductor pattern. A metal silicide pattern may be provided on a surface of a sidewall of the control gate pattern.

In an example embodiment, the transistor may include a tunnel oxide layer making contact with at least a portion of the sidewall of the single-crystalline semiconductor pattern, the contact portions of the tunnel oxide layer being spaced apart from one another in the vertical direction, a charge-trapping layer and a blocking dielectric layer provided on the tunnel oxide layer, at least one portion of the charge-trapping layer and the blocking dielectric layer facing the single-crystalline semiconductor pattern, and control gate patterns provided on the blocking dielectric layer to face the single-crystalline semiconductor pattern, the control gate patterns being spaced apart from one another in the vertical direction by a predetermined distance.

In an example embodiment, a metal silicide pattern may be provided on a surface of a sidewall of the control gate pattern.

In an example embodiment, the tunnel oxide layer may include a thermal oxide.

In an example embodiment, insulation interlayer patterns may be formed on the sidewall of the single-crystalline semiconductor pattern to insulate the transistors from one another.

According to some example embodiments, in a vertical-type non-volatile memory device, an insulation layer pattern is provided on a substrate, the insulation layer pattern having a linear shape that extends in a first direction on the substrate. Single-crystalline semiconductor patterns are provided on the substrate to make contact with first and second sidewalls of the insulation layer pattern, the single-crystalline semiconductor pattern having a pillar shape that extends in a vertical direction relative to the substrate. A tunnel oxide layer is provided on a sidewall of the single-crystalline semiconductor pattern. A charge-trapping layer and a blocking dielectric layer are provided on the tunnel oxide layer. A control gate pattern is provided on the blocking dielectric layer to face the sidewall of the single-crystalline semiconductor pattern, the control gate pattern having a linear shape.

In an example embodiment, a plurality of the tunnel oxide layers may be provided on the sidewall of each of the single-crystalline semiconductor patterns, the tunnel oxide layers being spaced apart from one another in an extension direction of the single-crystalline semiconductor pattern.

In an example embodiment, the control gate pattern may have a protruding shape from the sidewall of the single-crystalline semiconductor pattern, and a plurality of the control gate patterns may be spaced apart from one another by a predetermined distance and stacked in a multilayer structure.

In an example embodiment, a plurality of the insulation interlayer patterns may be provided in a gap between upper and lower layers of the control gate patterns, making contact with the sidewall of the single-crystalline semiconductor pattern. The tunnel oxide layer may be conformally formed to follow the profile of the sidewall of the single-crystalline semiconductor pattern, and upper and bottom surfaces of the insulation interlayer patterns. That is, the charge-trapping layers may be continuously connected to one another in an extension direction of the control gate pattern.

In an example embodiment, the charge-trapping layer may include silicon nitride or metal oxide.

In an example embodiment, the single-crystalline semiconductor pattern may include single-crystalline silicon.

In an example embodiment, a silicon oxide pattern may be provided between the adjacent control gate patterns to face the insulation layer pattern.

In an example embodiment, a bit line may be provided to make contact with upper surfaces of the single-crystalline semiconductor patterns.

In an example embodiment, one cell string may be provided in each of the single-crystalline semiconductor patterns and select transistors may be provided in upper and lower portions of each of the single-crystalline semiconductor patterns. The select transistor may have a structure substantially the same as the stacked structure of the tunnel oxide layer, the charge-trapping layer, the blocking dielectric layer and the control gate pattern laterally formed on the single-crystalline semiconductor pattern.

In an example embodiment, the sum of a line width of the insulation layer pattern and line widths of two single-crystalline semiconductor patterns provided on both sides of the insulation layer pattern may be substantially the same as the critical dimensions of the trench to be formed through a photolithography process.

In an example embodiment, the single-crystalline semiconductor pattern may have a rectangular parallelepiped shape.

In an example embodiment, the vertical-type non-volatile memory device may further include a metal silicide pattern provided on a surface of the control gate pattern to face the sidewall of the single-crystalline semiconductor pattern.

In an example embodiment, the metal silicide pattern may include cobalt silicide, nickel silicide, etc.

According to some example embodiments, in a method of manufacturing a vertical-type non-volatile memory device, an insulation layer structure including a trench is formed on a substrate, the trench having a linear shape to partially expose a surface of the substrate. An insulation layer pattern having a linear shape is formed in the trench, the insulation layer pattern being spaced apart from a sidewall of the trench. A preliminary single-crystalline semiconductor pattern is formed on both sidewalls of the trench to fill the trench, the preliminary single-crystalline semiconductor pattern having a pillar shape. A tunnel oxide layer is formed on a sidewall of the preliminary single-crystalline semiconductor pattern. A charge-trapping layer and a blocking dielectric layer are formed on the tunnel oxide layer. A control gate pattern is formed on the blocking dielectric layer to face the sidewall of the preliminary single-crystalline semiconductor pattern, the control gate pattern having a linear shape. The insulation layer pattern and the preliminary single-crystalline semiconductor pattern are partially removed to form single-crystalline semiconductor patterns having pillar shapes.

In an example embodiment, a metal silicide may be further formed on a surface of the control gate pattern.

In an example embodiment, in order to form the insulation layer structure, sacrificial layers and insulation interlayers may be formed repeatedly on the substrate. A portion of the repeatedly stacked layers may be anisotropically etched until a surface of the substrate is exposed, to form the trench having the linear shape extending in a first direction.

A portion of the insulation layer structure may be further etched to form insulation interlayer patterns that make contact with the sidewall of the single-crystalline semiconductor pattern, the insulation interlayer patterns being spaced apart from one another by a predetermined distance.

In order to form the insulation interlayer pattern, a portion of the insulation layer structure between the preliminary single-crystalline semiconductor patterns may be removed to form a first opening that extends in a first direction. The sacrificial layer exposed through a sidewall of the first opening may be removed such that the insulation interlayer remains thereon, to form second openings that partially expose the sidewall of the preliminary single-crystalline semiconductor pattern.

The preliminary single-crystalline semiconductor pattern exposed though a bottom surface of the second opening may be thermally oxidized to form the tunnel oxide layer.

In order to form the control gate pattern, a conductive layer may be formed on a surface of the blocking dielectric layer to fill the first and second openings. The conductive layer filling the first opening may be etched such that the conductive layer remains in the second opening.

In addition, a metal layer may be conformally deposited on a sidewall and a bottom surface of the opening formed by etching the conductive layer, and an upper surface of the sacrificial layer structure. The metal layer may be reacted with a surface of the control gate pattern to form a metal silicide pattern. The unreacted metal layer may be reacted.

The metal layer may be reacted with the control gate pattern by a thermal treatment process.

An insulation layer pattern may be further formed to fill the opening formed between the control gate patterns.

In order to form the insulation layer pattern and the preliminary single-crystalline semiconductor pattern, an amorphous silicon pattern may be formed on the sidewall of the trench, the amorphous silicon pattern having a spacer shape. The insulation layer pattern may be formed to fill the trench including the amorphous silicon pattern formed therein. The amorphous silicon pattern may be thermally treated to undergo phase transition to single-crystalline silicon, to form the preliminary single-crystalline semiconductor pattern including the single-crystalline silicon.

Thermally treating the amorphous silicon pattern to undergo phase transition to the single-crystalline silicon may be performed by a laser-induced epitaxial growth (LEG) process or a solid phase epitaxy (SPE) process.

In order to form the amorphous silicon pattern, an amorphous silicon layer may be conformally formed on the sidewall and the bottom surface of the trench and the upper surface of the insulation layer structure. The amorphous silicon layer may be anisotropically etched.

In another example embodiment, in order to form the insulation layer pattern and the preliminary single-crystalline semiconductor pattern, a sacrificial spacer may be formed on the sidewall of the trench. An insulation layer pattern may be formed to fill the trench including the sacrificial layer formed therein. The sacrificial spacer may be removed to form a fine trench through a bottom surface of which the substrate is exposed. The preliminary single-crystalline semiconductor pattern may be grown from the substrate in the fine trench.

In an example embodiment, in order to partially remove the preliminary single-crystalline semiconductor pattern to form the single-crystalline semiconductor patterns, a mask pattern may be formed on the insulation layer pattern, the preliminary single-crystalline semiconductor pattern and the insulation layer structure. The insulation layer pattern may be removed using the mask pattern to expose a portion of the sidewall of the preliminary single-crystalline semiconductor pattern. The exposed preliminary single-crystalline semiconductor pattern may be removed.

The mask pattern may have a linear shape or a contact shape.

A silicon oxide layer pattern may be further formed in an opening that is formed by removing the preliminary single-crystalline semiconductor pattern and the insulation layer pattern.

The method may further include a bit line making contact with upper surfaces of the single-crystalline semiconductor patterns.

According to some example embodiments, since a vertical-type non-volatile memory device has a structure in which cell transistors are connected in series in a vertical direction, the memory device may be highly integrated. Further, in the vertical non-volatile memory device, the cell transistors are provided in a pillar-shaped single-crystalline semiconductor pattern, and thus the operating speed of each of the cell transistors may be increased. Further, since the pillar-shaped single-crystalline semiconductor pattern has a line width smaller than a critical width, the memory device may be highly integrated.

BRIEF DESCRIPTION OF THE DRAWINGS

Example embodiments will be more clearly understood from the following detailed description taken in conjunction with the accompanying drawings. FIGS. 1 to 24 represent non-limiting, example embodiments as described herein.

FIG. 1 is a cross-sectional view illustrating a non-volatile memory device in accordance with a first example embodiment.

FIG. 2 is a perspective view illustrating the non-volatile memory device of FIG. 1.

FIGS. 3 to 14, 15A, 15B, 16A and 16B are cross-sectional views illustrating a method of manufacturing the vertical-type non-volatile memory device of FIG. 1 in accordance with the first example embodiment.

FIG. 17 is a partially enlarged view of a portion of FIG. 11.

FIGS. 18 to 26 are perspective views illustrating a method of manufacturing the vertical-type non-volatile memory device of FIG. 1 in accordance with the first example embodiment.

DETAILED DESCRIPTION OF EMBODIMENTS

Figure 1:
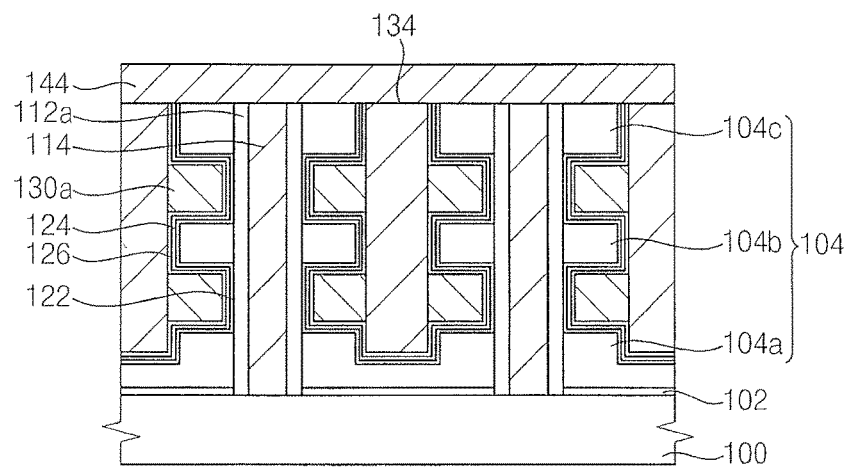

This application claims priority under 35 U.S.C. § 119 to Korean Patent Application No. 10-2008-0018980, filed on Feb. 29, 2008, and Korean Patent Application No. 10-2008-0096030, filed on Sep. 30, 2008 in the Korean Intellectual Property Office (KIPO), the contents of which are herein incorporated by reference in their entirety.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Embodiment 1

Figure 2:
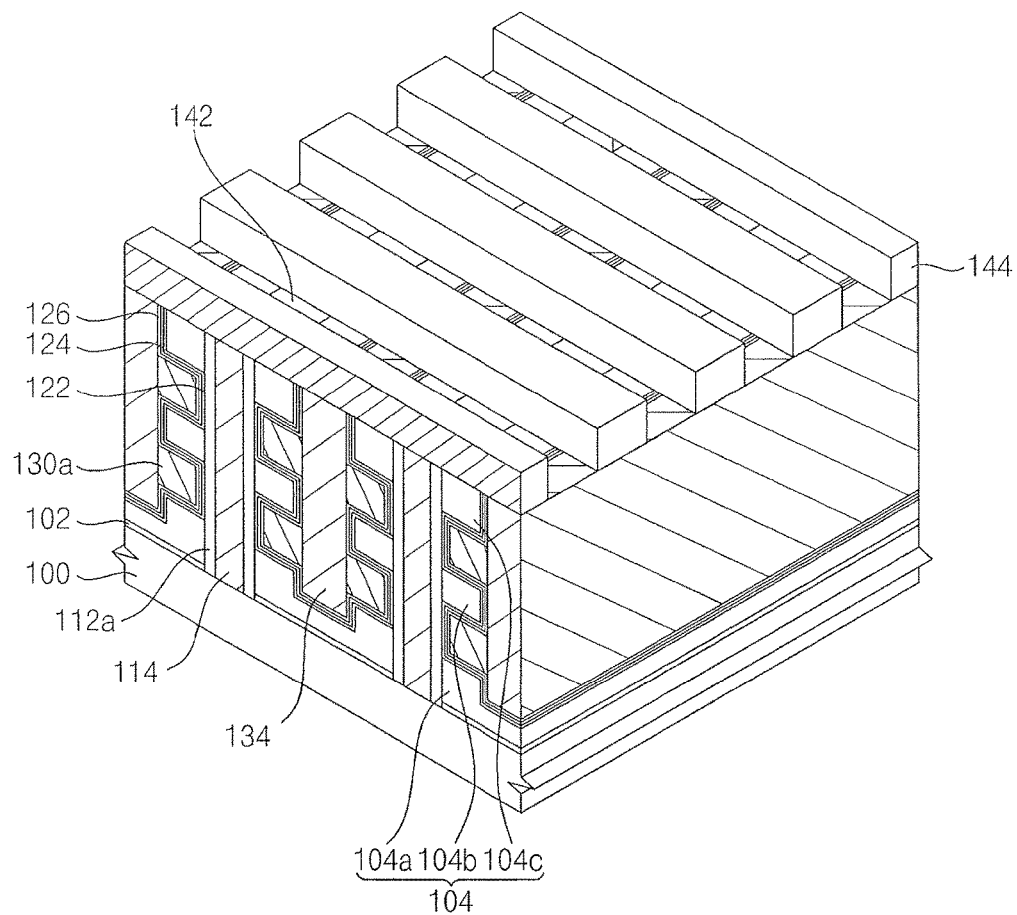

FIG. 1 is a cross-sectional view illustrating a non-volatile memory device in accordance with a first example embodiment. FIG. 2 is a perspective view illustrating the non-volatile memory device of FIG. 1.

Referring to FIGS. 1 and 2, a substrate 100 including a single-crystalline semiconductor material is provided. For example, the substrate 100 may include single-crystalline silicon.

An impurity region (not illustrated) is provided under a surface of the substrate 100 to be provided as a common source line. The impurity region is formed in a portion of the substrate where one cell block is formed. The impurity region may include n-type impurities. The impurity region may be connected to a lower portion of each of cell strings that is formed in a single-crystalline semiconductor pattern 112a.

An insulation layer pattern 114 is provided on the substrate 100. The insulation layer pattern 114 may have a linear shape extending in a first direction. An upper surface of the insulation layer pattern 114 may have substantially the same height as that of the single-crystalline semiconductor pattern 112a including cell transistors formed therein. The insulation layer pattern 114 may comprise, for example, silicon oxide.

The pillar-shaped single-crystalline semiconductor patterns 112a are provided on both sidewalls of the insulation layer pattern 114. A plurality of the single-crystalline semiconductor patterns 112a are repeatedly arranged on both the sidewalls of one insulation layer pattern 114. The single-crystalline semiconductor patterns 112a may have a sidewall inclination angle that is substantially perpendicular to the substrate 100. The single-crystalline semiconductor pattern 112a may have a rectangular parallelepiped shape.

The sum of a line width of the insulation layer pattern 114 and line widths of two single-crystalline semiconductor patterns 112a formed on both the sidewalls of the insulation layer pattern 114 may be reduced to a minimum width to be formed by a photolithography process.

For example, the single-crystalline semiconductor pattern 112a may include single-crystalline silicon. The single-crystalline silicon may be formed to undergo phase transition from amorphous silicon by a thermal treatment using a furnace or a laser-induced epitaxial growth (LEG) process. Alternatively, the single-crystalline silicon may be formed by a selective epitaxial growth (SEG) process using the substrate 100 as a seed.

The cell transistors are provided on a sidewall of the single-crystalline semiconductor pattern 112a opposite to the other sidewall thereof facing the insulation layer pattern 114. Hereinafter, the other sidewall of the single-crystalline semiconductor pattern 112a facing the insulation layer pattern 114 is referred to as a first sidewall, and the sidewall opposite to the first sidewall, in which the cell transistors are formed, is referred to as a second sidewall.

The cell transistors that are respectively formed in the single-crystalline semiconductor patterns 112a having the pillar shape constitutes one cell string. The cell transistors of a common cell string are connected to one another along the single-crystalline semiconductor patterns in a vertical direction. For example, the cell transistors numbering $2^m$ (where m is a natural number greater than 1) may be formed in one cell string on the substrate 100. In a non-volatile memory device of the present embodiment, as the number of the cell transistors included in the cell string is increased, the number of the cell transistors to be stacked in the vertical direction is increased so that it may be difficult to form the cell transistors. Accordingly, two, four or eight cell transistors may be connected in series to one another in one cell string. In this example embodiment, two cell transistors are shown as being connected in series to each other.

Insulation interlayer patterns 104 are provided on the second sidewall of the single-crystalline semiconductor pattern 112a to make contact with the second sidewall thereof. The insulation interlayer patterns 104 are spaced apart from one another by a predetermined distance. The insulation interlayer pattern 104 may have a linear shape. The insulation interlayer pattern 104 makes contact with a plurality of the single-crystalline semiconductor patterns 112a arranged in the first direction at once. A plurality of layers of the insulation interlayer patterns 104 spaced apart from one another are provided on to correspond with one of the single-crystalline semiconductor patterns 112a.

The cell transistor is provided in a gap between the insulation interlayer patterns 104. Accordingly, the insulation interlayer patterns 104 may define a region where the cell transistor is formed. The insulation interlayer patterns 104 insulate the control gate patterns 130a in different layers from one another.

Next, the insulation interlayer pattern 104 will be further explained in detail.

A pad oxide layer 102 is provided on the surface of the substrate 100 between combinations of the single-crystalline semiconductor patterns 112a and the insulation layer patterns 114.

A first insulation interlayer pattern 104a is provided between the pad oxide layer 102 and a first layer of a cell gate electrode. A second insulation interlayer pattern 104b is provided between the first layer of the cell gate electrode and a second layer of a cell gate electrode. A third insulation interlayer pattern 104c is provided between the second layer of the cell gate electrode and a third layer of a cell gate electrode.

The lowermost first insulation interlayer pattern 104a faces each of the sidewalls of the single-crystalline semiconductor patterns adjacent in a second direction substantially perpendicular to the first direction. On the other hand, each of the insulation interlayer patterns 104b and 104c in each of the layers on the first insulation interlayer pattern 104a faces the single-crystalline semiconductor patterns arranged in the first direction and have a linear shape extending in the first direction. However, each of the insulation interlayer patterns 104b and 104c in each of the layers on the first insulation interlayer pattern 104a does not face the sidewall of the adjacent other single-crystalline semiconductor pattern in the second direction.

The insulation interlayer patterns 104 may include a material that has etch selectivity with respect to both the insulation layer pattern and the single-crystalline semiconductor pattern. For example, the insulation interlayer pattern 104 may include silicon nitride.

As mentioned above, the cell transistors are provided in the second sidewalls of the single-crystalline semiconductor patterns 112a between the insulation interlayer patterns 104.

Next, the cell transistor formed on the single-crystalline semiconductor pattern 112a will be further explained in detail.

A tunnel oxide layer 122 is provided on a sidewall of the single-crystalline semiconductor pattern 112a. The tunnel oxide layer 122 makes contact with at least a portion of the sidewall of the single-crystalline semiconductor pattern. The contact portions thereof are spaced apart from one another in the vertical direction by a predetermined distance. The tunnel oxide layer 122 makes discontinuous contact with the sidewall of the single-crystalline semiconductor pattern.

The surface of the single-crystalline semiconductor pattern is thermally oxidized to form the tunnel oxide layer 122. The tunnel oxide layer 122 may include a silicon oxide layer formed by a thermal oxidation process.

A portion of the single-crystalline semiconductor pattern 112a is thermally oxidized to form the tunnel oxide layer 122, and thus the tunnel oxide layer 122 may have excellent durability, as compared with the tunnel oxide layer formed by a chemical vapor deposition (CVD) process. Therefore, a non-volatile memory device according to the present embodiment may have excellent reliability.

Alternatively, the tunnel oxide layer 122 may include oxide formed by a CVD process.

As illustrated in the figures, the tunnel oxide layer 122 may be conformally formed on surfaces of the single-crystalline semiconductor pattern 112a and the insulation interlayer patterns 104. In this case, each of the tunnel oxide layers 122 in each of the layers may not be divided to be connected to one another.

Alternatively, although not illustrated in the figures, the tunnel oxide layer 122 may be provided only on the sidewall of the single-crystalline semiconductor pattern 112a between the insulation interlayer patterns 104.

Alternatively, although not illustrated in the figures, the tunnel oxide layer 122 may be conformally formed on the sidewall of the single-crystalline semiconductor pattern 112a, and bottom surfaces and upper surfaces of the insulation interlayer patterns 104. However, the tunnel oxide layer 122 may not be formed on a sidewall of the insulation interlayer pattern 104. Accordingly, a plurality of the tunnel oxide layers 122 respectively formed on the sidewalls of the single-crystalline semiconductor patterns 112a may be spaced apart from one another in the vertical direction.

A charge-trapping layer 124 is provided on the tunnel oxide layer 122.

The charge-trapping layer 124 may include silicon nitride or metal oxide that is capable of trapping electric charge. In this case, the electrical charge may be stored in the charge-trapping layer 124 using a charge-trapping method. The charge-trapping layer 124 may be formed using silicon nitride to be deposited to a relatively small thickness.

The charge-trapping layers 124 in the same layer can be connected to one another in the first direction. However, since the charge-trapping layer 124 includes an insulating material, even though the charge-trapping layers 124 are connected to one another in the first direction, each of the cell transistors sharing the charge-trapping layers 124 with one another are therefore not electrically connected to one another.

As illustrated in the figures, the charge-trapping layers 124 formed on the same single-crystalline semiconductor pattern 112a may be connected to one another in the vertical direction. The charge-trapping layer 124 may be formed to follow the profile of the sidewall of the single-crystalline semiconductor pattern, and the bottom surfaces and the upper surfaces of the insulation interlayer patterns. Alternatively, although not illustrated in the figures, the charge-trapping layers 124 formed on the same single-crystalline semiconductor pattern 112a need not be connected so that they are spaced apart from one another in the vertical direction.

A blocking dielectric layer 126 is provided on the charge-trapping layer 124. The blocking dielectric layer 126 may include silicon oxide or metal oxide. Here, the metal oxide may have a higher dielectric constant than the silicon nitride layer. Like the charge-trapping layer 124, the blocking dielectric layers 126 in the same layer are connected to one another laterally in the first direction.

As illustrated in the figures, the blocking dielectric layers 126 formed on the same single-crystalline semiconductor pattern 112a may be connected to one another in the vertical direction. The blocking dielectric layer 126 may be formed to follow the profile of the sidewall of the single-crystalline semiconductor pattern, and the bottom surfaces and the upper surfaces of the insulation interlayer patterns. Alternatively, the charge-trapping layers 124 formed on the same single-crystalline semiconductor pattern 112a need not be connected so that they are spaced apart from one another in the vertical direction.

The charge-trapping layer 124 and the blocking dielectric layer 126 face the second sidewall of the single-crystalline semiconductor pattern and the upper surfaces and the bottom surfaces of the insulation interlayer patterns 104.

Control gate patterns 130a are provided in the gap between the insulation interlayer patterns on the surface of the blocking dielectric layer 126. Upper and lower surfaces and a sidewall of the control gate patterns 130a face the blocking dielectric layer 126. The control gate patterns 130a face the single-crystalline semiconductor pattern 112a. In the embodiment, two control gate patterns 130a are provided in the first and second layers.

The control gate patterns 130a in the same layer arranged in the first direction may have a linear shape. Accordingly, the control gate pattern 130a may be provided as a word line. On the other hand, the control gate patterns 130a of different layers are insulated from each other by the insulation interlayer patterns 104.

A silicon oxide layer pattern 134 is provided between the insulation interlayer patterns 104 and the control gate patterns 130a in the second direction. The second direction may be substantially perpendicular to the first direction. Therefore, the silicon oxide layer pattern 134 faces the insulation layer pattern 114. That is, the silicon oxide layer pattern 134 has a linear shape extending in the first direction. The silicon oxide layer pattern 134 is parallel with the insulation layer pattern 114. The control gate patterns 130a respectively formed on the sidewalls of the adjacent single-crystalline semiconductor patterns 112a are insulated by the silicon oxide layer pattern 134.

Bit lines 144 are provided on the upper surfaces of the single-crystalline semiconductor patterns 112a to electrically connect the single-crystalline semiconductor patterns 112a. Each bit line 144 may have a linear shape extending in the second direction. As illustrated in the figures, in this embodiment, because the bit lines 144 directly contact the upper surfaces of the single-crystalline semiconductor patterns 112a, bit line contact plugs may not be required.

Alternatively, the bit line contact plug may be provided to contact the upper surface of the single-crystalline semiconductor pattern 112a. In this case, an upper insulation interlayer may be required to be provided on the upper surfaces of the single-crystalline semiconductor pattern 112a, the insulation layer pattern 114, the insulation interlayer patterns 104 and the silicon oxide layer pattern 134, and thus the bit line contact plugs may be formed in the upper insulation interlayer. In this example, the bit line is formed on the upper insulation interlayer.

Although not illustrated in the figures, in an embodiment, upper and lower select transistors including a gate insulation layer pattern and a gate electrode may be provided on each of the uppermost and lowermost sidewalls of the single-crystalline semiconductor pattern 112a. The upper select transistor may be provided between the bit line 144 and the uppermost cell transistor and the lower select transistor may be provided between the substrate and the lowermost cell transistor.

The upper and lower select transistors may have substantially the same configuration. The gate insulation layer of the upper and lower select transistors may include substantially the same layers as the silicon oxide layer 122, the silicon nitride layer 124 and the silicon oxide layer 126. The control gate electrode of the upper and lower select transistors may have substantially the same shape as the control gate pattern 130a.

N-type impurities may be doped throughout the single-crystalline semiconductor pattern 112a. In this case, the cell transistors and the select transistor may be in the on-state without an applied voltage, and may be switched from the on-state to the off-state by the applied voltage to the gate electrode.

However, alternatively, a source/drain region (not illustrated) doped with n-type impurities may be provided under the surface of the sidewall of the single-crystalline semiconductor pattern 112a facing the insulation interlayer patterns. A channel doping region doped with p-type impurities that are the opposite conductive type to that of the source/drain region may be provided under the surface of the sidewall of the single-crystalline semiconductor pattern 112a facing the tunnel oxide layers 122.

In the above-mentioned non-volatile memory device, one cell string is provided in the pillar-shaped single-crystalline semiconductor pattern. Two single-crystalline semiconductor patterns are provided within a very narrow area within a trench to be formed. That is, two single-crystalline semiconductor patterns are provided within critical dimensions of the trench. Therefore, the number of the cell strings to be formed on a unit area may be increased, and thus the degree of integration of the device may be improved.

Further, since the single-crystalline semiconductor pattern has a sidewall inclination angle substantially perpendicular to the substrate, the degree of integration of the device may be further improved. Further, since the cell transistor may be formed in the single-crystalline semiconductor pattern with hardly any crystal defects, a cell current and cell distribution characteristics of the cell transistor may be excellent.

Further, each of the tunnel oxide layers included in each of the cell transistors formed in the vertical direction includes a thermal oxidation layer, and thus the durability of the cell transistor may be excellent.

FIGS. 3 to 14, 15A, 15B, 16A and 16B are cross-sectional views illustrating a method of manufacturing the vertical-type non-volatile memory device in FIG. 1 in accordance with the first example embodiment. FIG. 17 is a partially enlarged view of a portion of FIG. 11. FIGS. 18 to 26 are perspective views illustrating a method of manufacturing the vertical-type non-volatile memory device of FIG. 1 in accordance with the first example embodiment.

Figure 3:
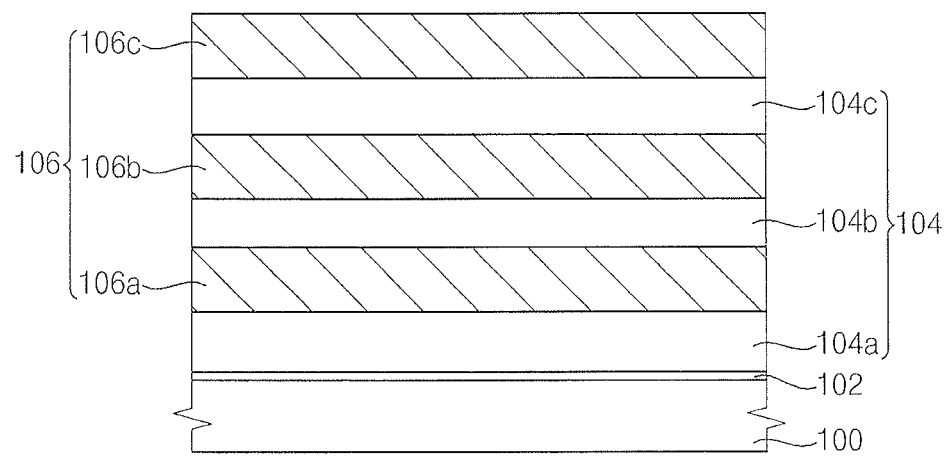

Referring to FIG. 3, a substrate 100 including single-crystalline silicon is prepared. N-type impurities are partially doped into the substrate to form impurity regions (not illustrated). The impurity region may be provided as a source line of a NAND flash memory device. The n-type impurities are doped under a surface of the substrate where one cell block is formed, to form the impurity region.

A pad oxide layer 102 is formed on the substrate 100 including the impurities therein. The pad oxide layer 102 may be formed by a thermal oxidation process or a CVD process. The pad oxide layer 102 may be provided to reduce stress that can be otherwise generated when an insulation interlayer including silicon nitride is formed directly on the substrate 100.

An insulation interlayer 104 and a sacrificial layer 106 are repeatedly formed on the pad oxide layer 102. The insulation interlayer 104 and the sacrificial layer 106 may be formed by a CVD process.

The sacrificial layer 106 may have a material having an etch selectivity with respect to the insulation interlayer 104 and single-crystalline silicon. The sacrificial layer 106 may be formed of a material that may be easily removed by a wet etching process. In this embodiment, the sacrificial layer 106 may include silicon oxide and the insulation interlayer 104 may include silicon nitride. Hereinafter, the sacrificial layer 106 is referred to as a silicon oxide layer and the insulation interlayer 104 is referred to as a silicon nitride layer.

In this embodiment, an insulation interlayer 104a may be provided in the lowermost portion of the repeatedly stacked structure and a sacrificial layer 106c may be provided in the uppermost portion of the structure.

The sacrificial layers 106 are removed by a subsequent process to thereby define a region where a control gate pattern of each layers is formed. Therefore, the sacrificial layer 106 may have a thickness greater than or equal to the desired effective length of the control gate pattern of each of the layers.

Because the control gate pattern is formed in the portion of the structure where the sacrificial layer 106 is removed, the stacked number of the sacrificial layer 106 and the insulation interlayer 106 may be greater than or equal to the number of the cell transistors included in the cell string. In this embodiment, because two cell transistors are to be included in each cell string, as illustrated in the figures, first, second and third insulation interlayers 104a, 104b and 104c and first, second and third sacrificial layers 106a, 106b and 106c may be alternately stacked with one another.

Although not illustrated in the figures, when a selection transistor is formed on both sides of the cell transistors that are arranged in a vertical direction (that is, an extension direction of a single-crystalline pattern), a sacrificial layer and an insulation interlayer for defining a portion where the selection transistor is formed may be additionally formed.

Figure 4:
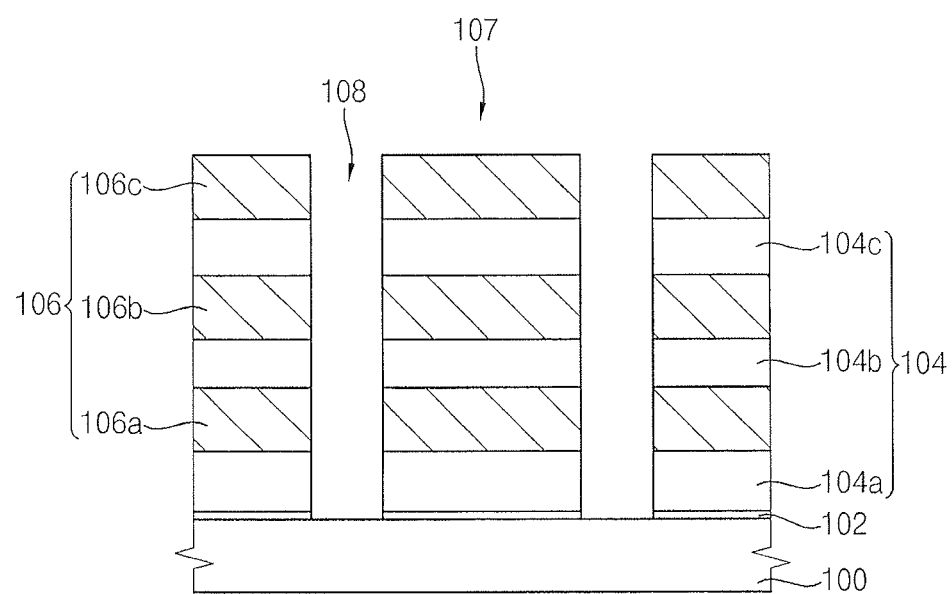
Figure 18:
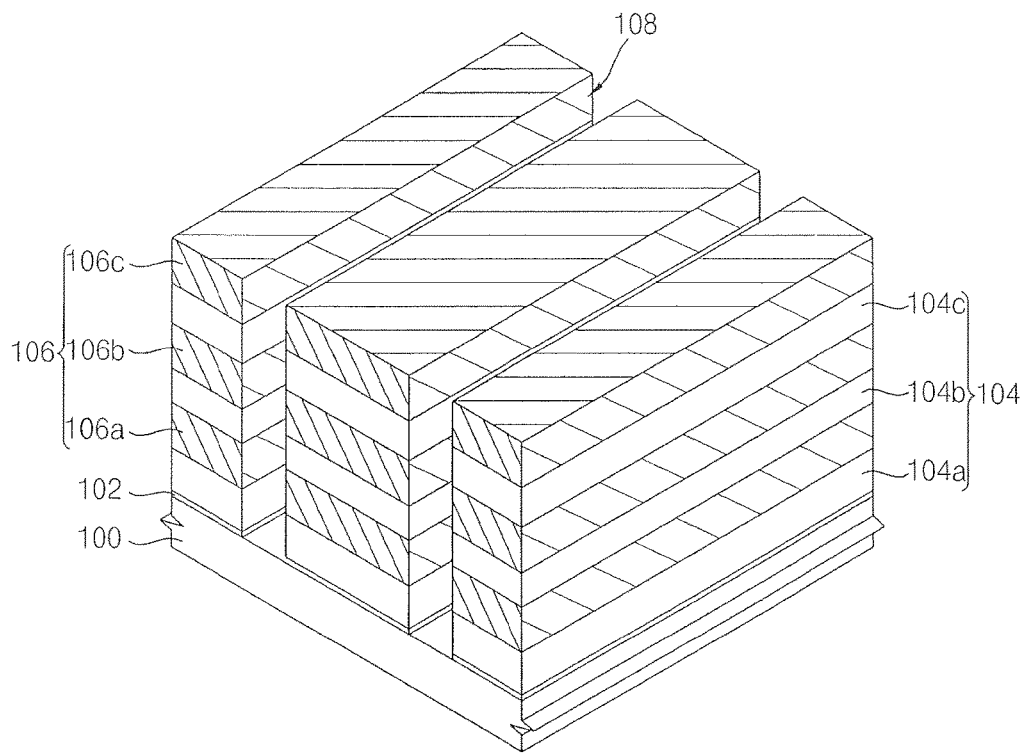

Referring to FIGS. 4 and 18, a first photoresist pattern (not illustrated) is formed on the uppermost sacrificial layer 106c. The first photoresist pattern may have a linear shape extending in the first direction.

The sacrificial layers 106 and the insulation interlayers 104 are etched using the first photoresist pattern as an etch mask to form an insulation layer structure 107 including a first trench 108 extending in the first direction. The insulation layer structure 107 may have a linear shape extending in the first direction. The surface of the single-crystalline silicon substrate 100 is exposed by the first trench 108.

In order to manufacture a highly integrated semiconductor device, the first trench may have a minimum width to be formed through a photolithography process. By a following process, a pillar single-crystalline silicon pattern is formed on both sidewalls of the first trench 108.

Figure 5:
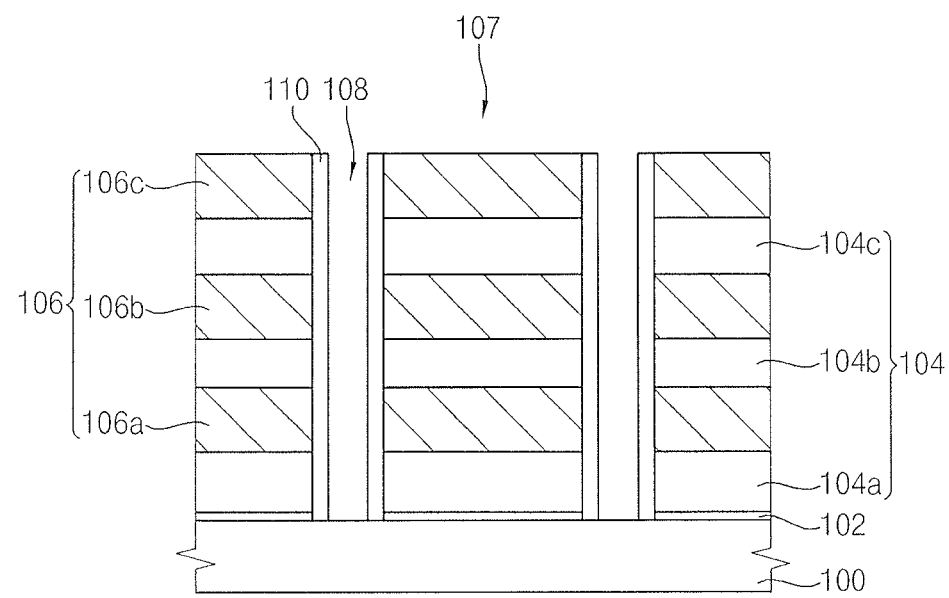
Figure 19:
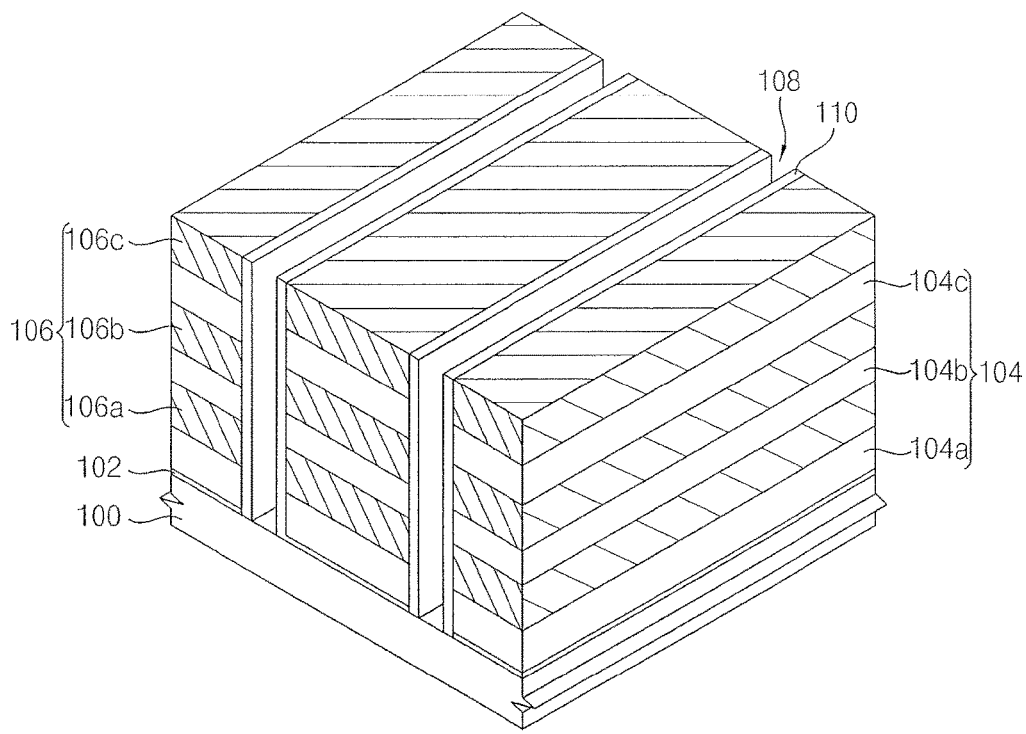

Referring to FIGS. 5 and 19, an amorphous silicon layer (not illustrated) is formed on the sidewalls of the first trenches 108, the surface of the substrate and upper surfaces of the insulation layer structure 107. The amorphous silicon layer may be formed by a CVD process. In the CVD process, n-type impurities may be doped in situ to form an n-type impurity-doped amorphous silicon layer. Alternatively, a polysilicon layer may be formed on the sidewalls of the first trenches 108, instead of the amorphous silicon layer.

The amorphous silicon layer is anisotropically etched such that the amorphous silicon layer remains only on both the sidewalls of the first trench 108, to form an amorphous silicon pattern 110 having a spacer shape.

Figure 6:
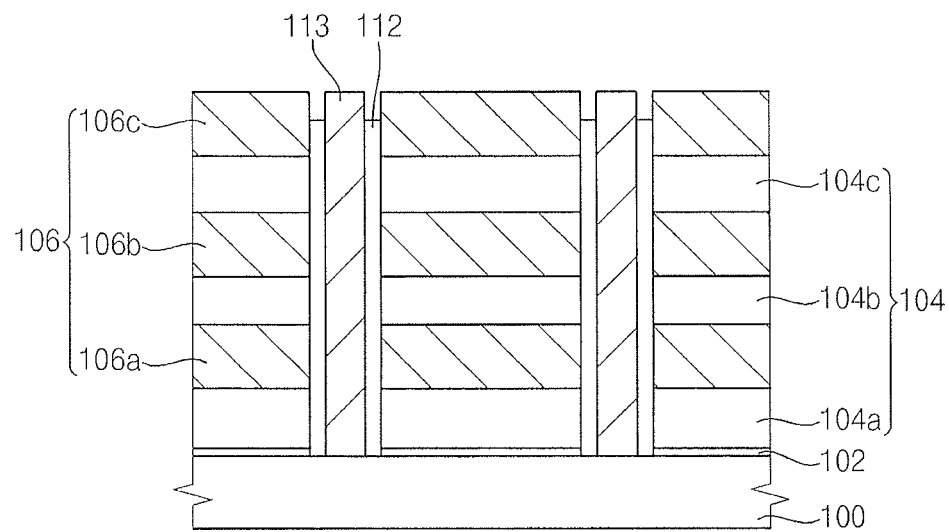

Referring to FIG. 6, silicon oxide (not illustrated) is formed to fill the first trench 108 having the amorphous silicon pattern 110 formed therein. The silicon oxide layer is partially planarized until the upper surface of the amorphous silicon pattern 110 is exposed, to form a silicon oxide layer pattern 113.

The amorphous silicon pattern 110 undergoes a phase transition to form a preliminary single-crystalline silicon pattern 112. The preliminary single-crystalline silicon pattern 112 may be formed by an LEG process, an SPE process or a metal-induced crystallization process using a metal catalyst. The thermal treatment may be performed using a laser, a furnace, etc. When the furnace is used for the thermal treatment, amorphous silicon may be thermally treated at a temperature of about 600° C. to 700° C. for several hours to undergo phase transition to single-crystalline silicon.

In the LEG process, the laser used for the thermal treatment may have an energy density sufficient to completely melt the amorphous silicon pattern 110.

In particular, as a laser beam is irradiated on the amorphous silicon pattern 110, the amorphous silicon pattern 110 is melted to be changed from a solid phase to a liquid phase. The phase transition occurs from the upper surface of the amorphous silicon pattern 110 to the upper surface of the substrate 100 beneath the bottom surface of the first trench 108. For example, the laser beam may be irradiated at a temperature of about 1,410° C., the melting point of silicon.

Accordingly, the single crystal of the substrate 100 is used as a seed for the liquefied amorphous silicon pattern 110, and thus the crystal structure of the amorphous silicon pattern 110 is changed to a single-crystalline structure. For example, an excimer laser, a kind of a gas laser, may be used in a laser unit for irradiating the laser beam. The laser unit may irradiate a laser beam using a scanning method, and thus the laser beam may be irradiated in a relatively short time.

While the laser beam is irradiated, the substrate 100 may likewise be heated. Thus, when the amorphous silicon pattern 110 undergoes a phase transition by the irradiation of the laser beam, the substrate 100 is heated together to thereby reduce a temperature gradient in a layer where the phase transition occurs. For example, when the laser beam is irradiated, the substrate 100 may be heated to about 400° C.

Thus, the laser beam is irradiated to the amorphous silicon pattern 110 to change the crystal structure of the amorphous silicon pattern 110 into single-crystalline silicon, to thereby form a preliminary single-crystalline silicon pattern 112 along both the sidewalls of the first trench 108. The height of the preliminary single-crystalline silicon pattern 112 may become less than that of the amorphous silicon pattern 110.

Figure 7:
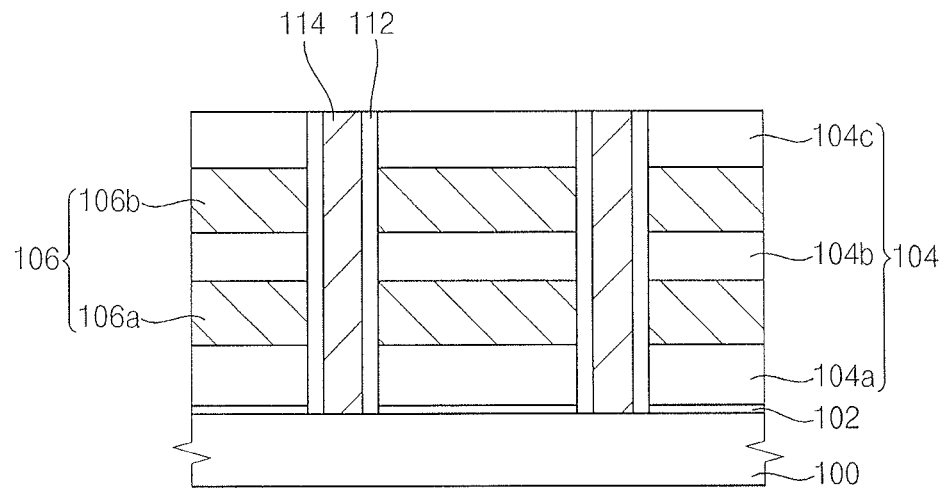
Figure 20:
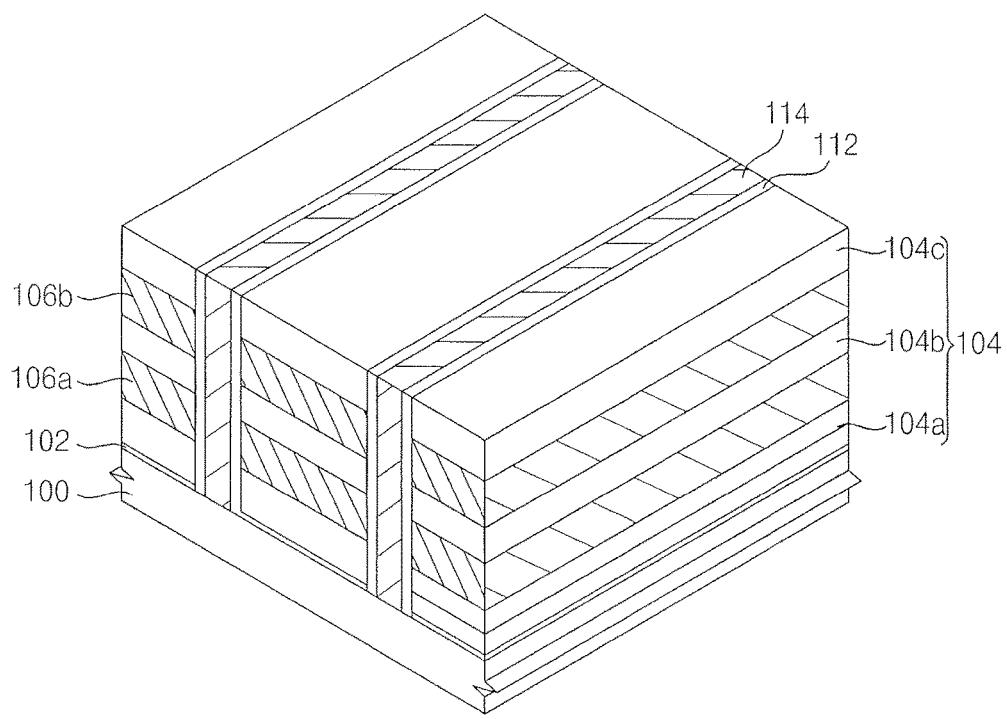

Referring to FIGS. 7 and 20, portions of the silicon oxide layer pattern 113 and the preliminary single-crystalline silicon pattern 112, and the uppermost sacrificial layer 106c are planarized until an upper surface of the uppermost insulation interlayer 104c is exposed, to form an insulation layer pattern 114 filling the first trench 108. By performing the planarization process, the preliminary single-crystalline silicon pattern 112 may have an evened upper surface.

Figure 8:
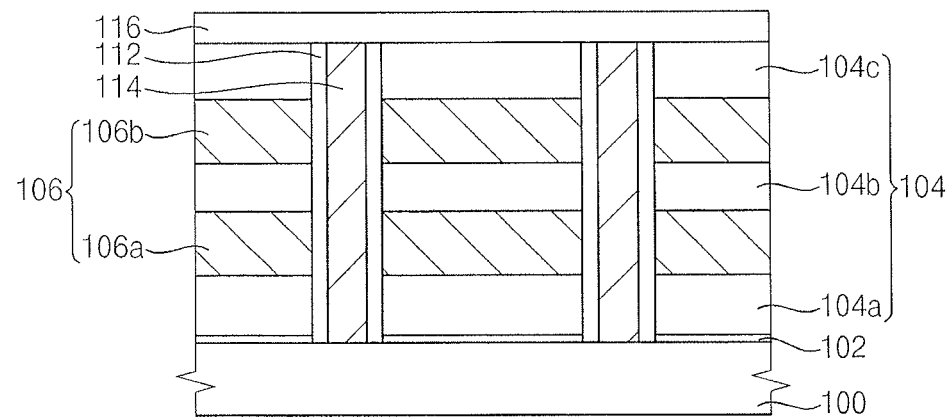

Referring to FIG. 8, a capping layer 116 is formed on the insulation layer structure, the insulation layer pattern 114 and the preliminary single-crystalline silicon pattern 112. The capping layer 116 may be formed using silicon nitride by a deposition process.

Figure 9:
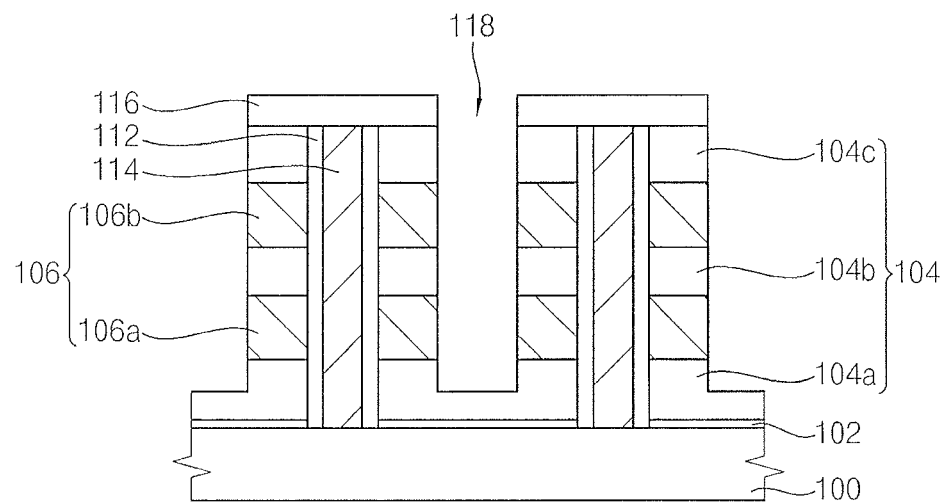
Figure 21:
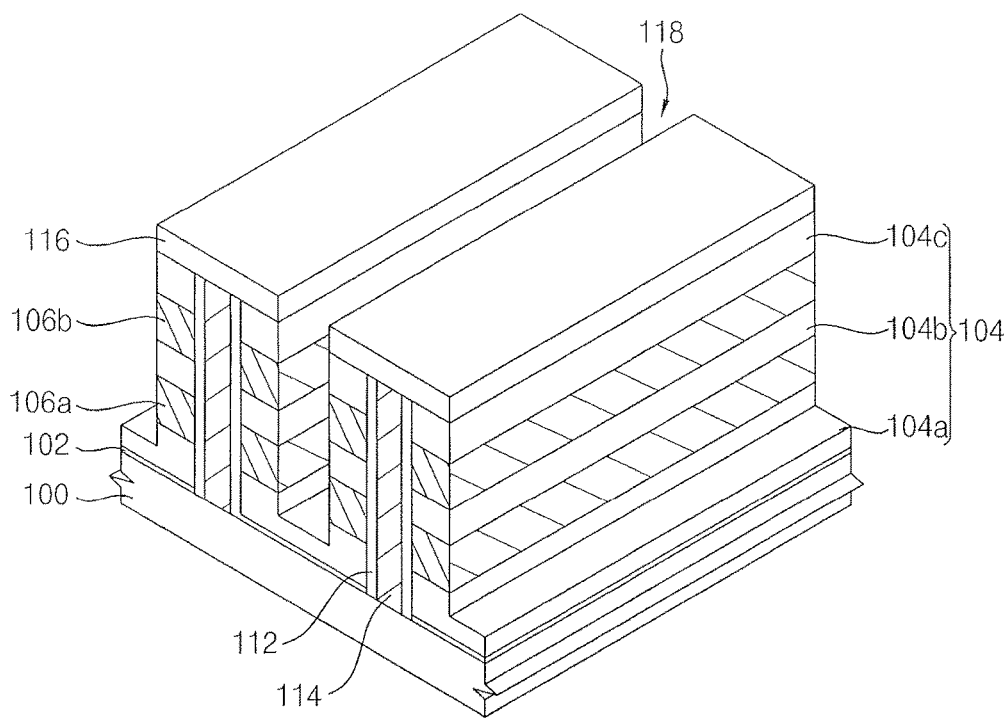

Referring to FIGS. 9 and 21, a second photoresist pattern (not illustrated) is formed on the capping layer 116 to expose a portion of the insulation layer structure between preliminary single-crystalline silicon patterns 112. The portion exposed by the second photoresist pattern may have a linear shape.

The capping layer 116 and each of the layers of the insulation layer structure are sequentially etched using the second photoresist pattern as an etching mask to form a first opening 118. In particular, the insulation interlayer included in the insulation layer structure and the sacrificial layers 106 are sequentially etched. In this case, the etching process may be performed such that the surface of the single-crystalline silicon substrate 100 beneath a bottom surface of the first opening 118 is not exposed. Therefore, by the etching process, the lowermost insulation interlayer 104a may be exposed through the bottom surface of the first opening 118. The first opening 118 formed by the etching process may have a linear shape extending in the first direction.

Figure 10:
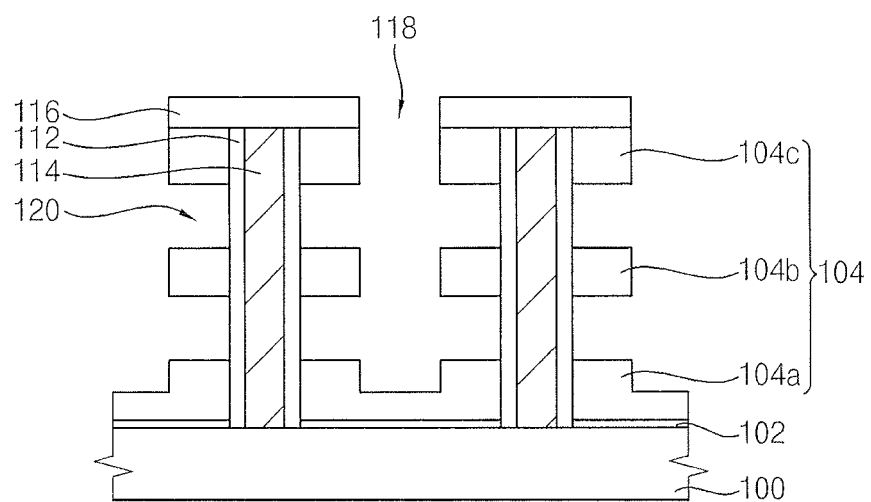
Figure 22:
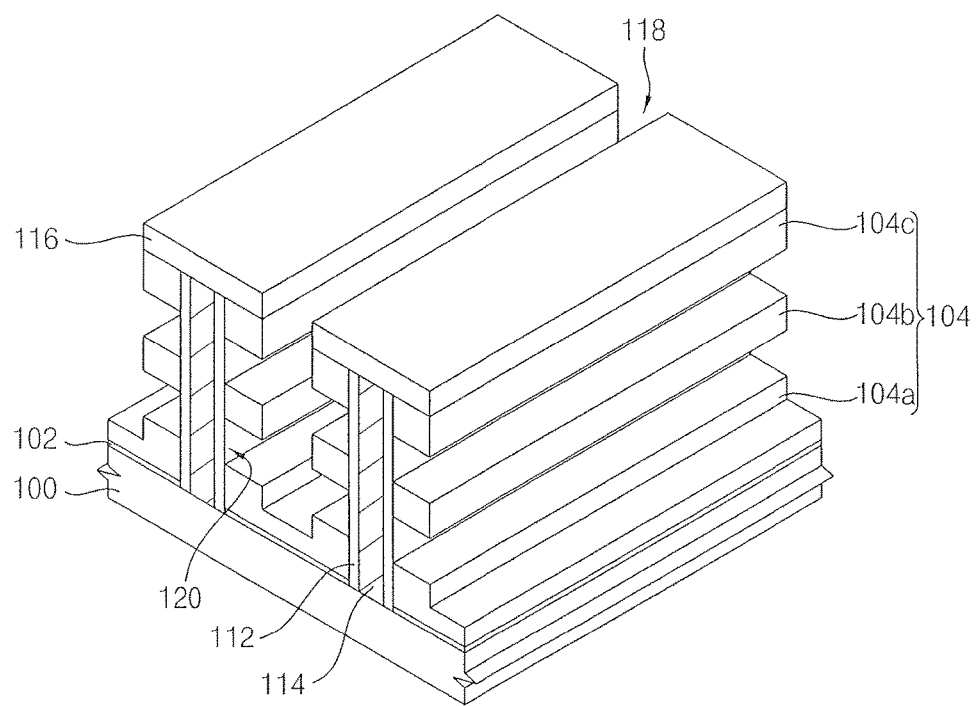

Referring to FIGS. 10 and 22, each of the remaining portions of the sacrificial layers 106 that is exposed through sidewalls of the first opening 118 is removed by a wet etching process, to form a second opening 120 connected to a side of the first opening 118. The sidewalls of the preliminary single-crystalline silicon pattern 112 are partially exposed through the second opening 120.

By performing the etching process, insulation interlayer patterns 104 are formed on portions of the sidewalls of the preliminary single-crystalline silicon pattern 112 to extend in the first direction. The second opening 120 is formed between the insulation interlayer patterns 104. A cell transistor can be formed in the second opening 120, for example, according to the following process.

The exposed portion of the preliminary single-crystalline silicon pattern 112 may correspond to a channel region. The portion of the preliminary single-crystalline silicon pattern 112 that is covered with the insulation layer pattern 104 may correspond to a source/drain region.

Accordingly, after forming the second opening 120, p-type impurities can be implanted into the exposed portion of the preliminary single-crystalline silicon pattern 112 to form a doped channel region. The impurities may be implanted uniformly into the exposed sidewalls of the preliminary single-crystalline silicon pattern 112 by a plasma doping (PLAD) process. The implanted impurities in the doped channel region may control a threshold voltage of the cell transistor.

However, since the thickness of the finally formed single-crystalline silicon pattern is relatively very small, it may be difficult to form the doped channel region. Accordingly, the impurity implantation process for forming the doped channel region may be omitted.

Figure 11:
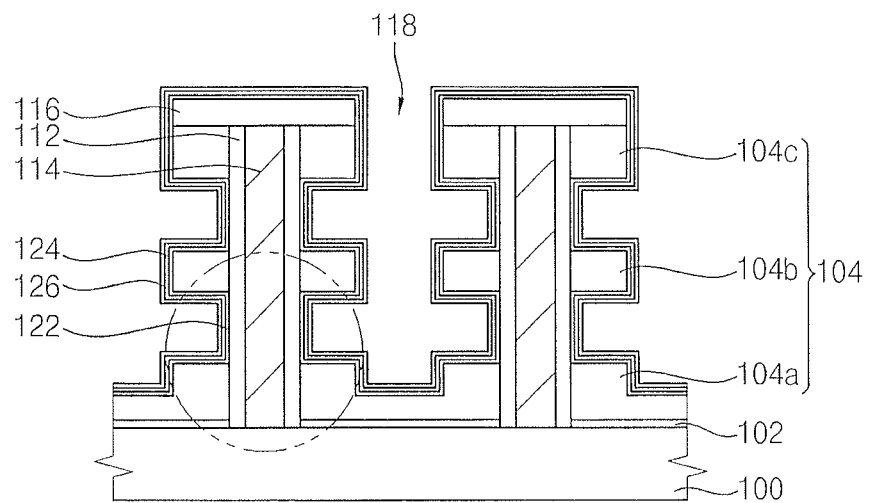

Referring to FIGS. 11 and 17, the exposed portion of the preliminary single-crystalline silicon pattern 112 is thermally oxidized to form a tunnel oxide layer 122.

The tunnel oxide layer 122 may be formed by a thermal oxidation process. Thus, the tunnel oxide layer 122 formed by a thermal oxidation process may have improved durability, to thereby improve the reliability of the completed cell transistor. Alternatively, the tunnel oxide layer 122 may be formed by a CVD process.

As mentioned above, by performing a thermal oxidation process, the tunnel oxide layer 122 is formed on the exposed surface of the preliminary single-crystalline silicon pattern 112. Alternatively, or additionally, the tunnel oxide layer 122 having a relatively small thickness may also be formed on surfaces of the insulation interlayer patterns 104 and the capping layer 116 that includes silicon nitride. The tunnel oxide layer 122 may be formed on the surfaces of the preliminary single-crystalline silicon pattern 112, the insulation interlayer patterns 104 and the capping layer 116.

Alternatively, conditions of the thermal oxidation process may be controlled to form the tunnel oxide layer 122 only on the surface of the preliminary single-crystalline silicon pattern 122 and not on the surfaces of the insulation interlayer patterns 104 and the capping layer. In this case, the separate tunnel oxide layer portions 122 may be formed on each of the layers.

A charge-trapping layer 124 is formed on a surface of the tunnel oxide layer 122. The charge-trapping layer 124 may be formed by a CVD process.

The charge-trapping layer 124 may be formed using silicon nitride or metal oxide. Because silicon nitride and metal oxide are an insulating material, even though the material is conformally formed on the surfaces of the tunnel oxide layer 122, each of the cell transistors may not be electrically connected to one another.

A blocking dielectric layer 126 is formed on a surface of the charge-trapping layer 124. The blocking dielectric layer 126 may be formed using silicon oxide or metal oxide.

Figure 12:
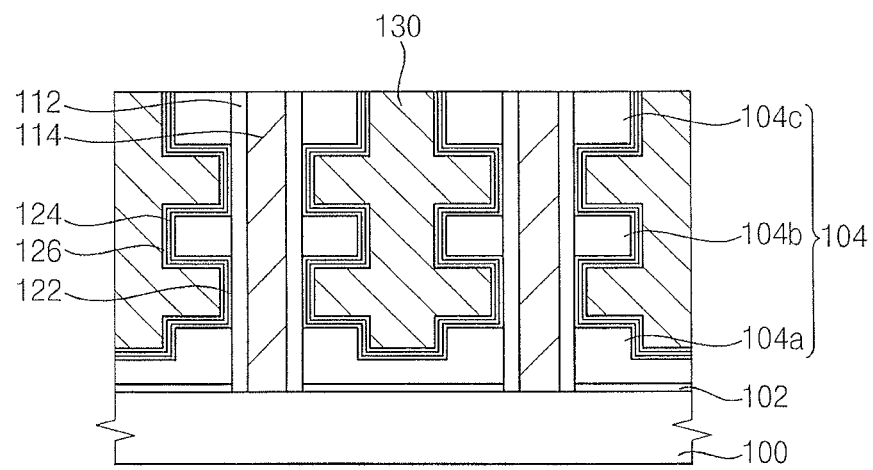

Referring to FIG. 12, a conductive layer (not illustrated) is formed on the blocking dielectric layer 126 to fill the first opening 118 and the second opening 120. The conductive layer may be provided as a control gate pattern by a following process.

The conductive layer may be formed using a material having excellent step coverage so as to prevent voids from being generated in the conductive layer filling the first and second openings 118 and 120. Accordingly, the conductive layer may be formed using doped polysilicon.

After the deposition of the conductive layer, the conductive layer is planarized until the upper surface of the uppermost insulation interlayer 104c is exposed, to form a conductive layer pattern 130 in the first and second openings 118 and 120. In the planarization process, the capping layer 116 is completely removed from the substrate. Additionally, the tunnel oxide layer 122, the charge-trapping layer 124 and the blocking dielectric layer 126 on the capping layer 116 are removed together.

Alternatively, although not illustrated in the figures, the conductive layer may be planarized until the capping layer 116 is exposed, such that the capping layer 116 remains. In this case, the remaining capping layer 116 may be used as a hard mask pattern in a subsequent anisotropic etching process of the conductive layer pattern 130. Here, the capping layer may have a thickness sufficient to be used as a hard mask pattern.

Thus, in this embodiment, a floating gate pattern is formed by a gate replacement process where the second opening 120 to define a floating gate forming region is filled with a conductive material. Accordingly, the floating gate pattern may be formed without causing damage to an edge of the tunnel oxide layer, as compared with using a conventional photolithography/etching process. Further, a damage curing process, such as re-oxidation process after forming the floating gate pattern, is not necessary to perform. Therefore, a defect such as a bird's beak structure may be prevented from being generated at the edge of the tunnel oxide layer of each of the cell transistors.

Figure 13:
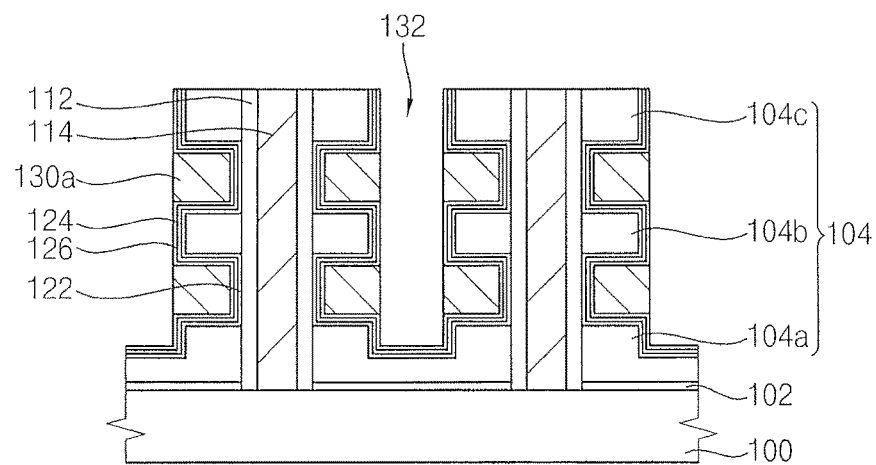
Figure 23:
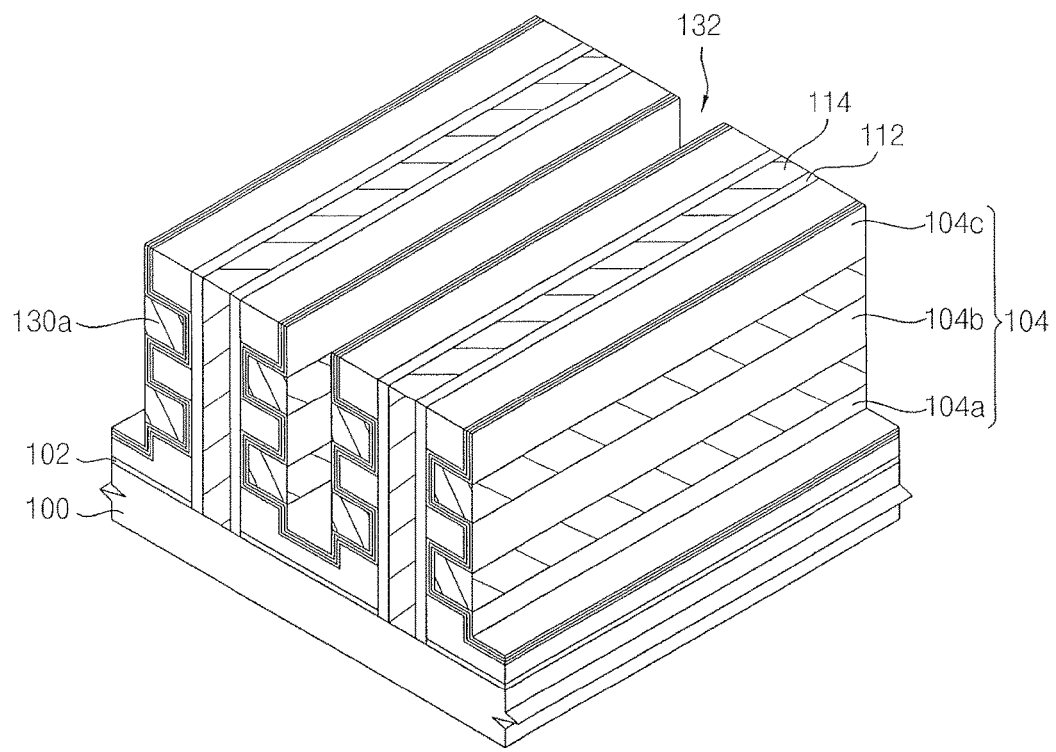

Referring to FIGS. 13 and 23, a third photoresist pattern (not illustrated) is formed on an upper surface of the resultant structure to selectively expose a portion of the conductive layer pattern 130 formed in the first opening 118. The third photoresist pattern may have an exposed portion the same size as, or larger than, the first opening 118.

The exposed conductive layer pattern 130 is anisotropically etched using the third photoresist pattern as an etching mask to form a third opening 132 that separates the conductive layer patterns 130 in each of the layers apart from one another in the vertical direction. The third opening 132 may have the same shape as the first opening 118. Accordingly, the lowermost insulation interlayer 104a may be exposed through a bottom surface of the third opening 132.

By the above-mentioned process, control gate patterns 130a are formed between each of the layers of the insulation interlayer 104. An upper surface, a lower surface and a sidewall of the control gate pattern 130a face the blocking dielectric layer pattern.

The control gate pattern 130a in each of the layers may have a linear shape extending in the first direction. The control gate patterns 130a of the same layer need not be connected to one another and need not surround the preliminary single-crystalline silicon pattern 112. The control gate patterns 130a in the different layers may be insulated from one another.

As illustrated in the figures, in a process of forming the third opening 132, the blocking dielectric layer 126, the charge-trapping layer 126 and the tunnel oxide layer 122 on the sidewalls of the first opening may not be etched. In this case, the tunnel oxide layer 122, the blocking dielectric layer 126 and the charge-trapping layer 124 in the same layer may be connected to one another to extend in the first direction. Additionally, the tunnel oxide layer 122, the blocking dielectric layer 126 and the charge-trapping layer 124 may be connected to one another along a vertical direction relative to the surface of the substrate 100.

Although not illustrated in the figures, alternatively, in a process of forming the third opening 132, the blocking dielectric layer 126 and the charge-trapping layer 124 on the sidewalls of the first opening 118 may be etched together with the conductive layer pattern 130. In this case, the tunnel oxide layer 122, the blocking dielectric layer 126 and the charge-trapping layer 124 in the same layer may be connected to one another to extend in the first direction. However, the tunnel oxide layer 122, the blocking dielectric layer 126 and the charge-trapping layer 124 may not be connected to one another along the vertical direction relative to the surface of the substrate 100.

Although not illustrated in the figures, as mentioned above, the capping layer may be used as a hard mask. In this case, a process of forming the third photoresist pattern may not be required. The conductive layer pattern may be anisotropically etched using the capping layer as an etching mask to form the control gate pattern 130a.

Figure 14:
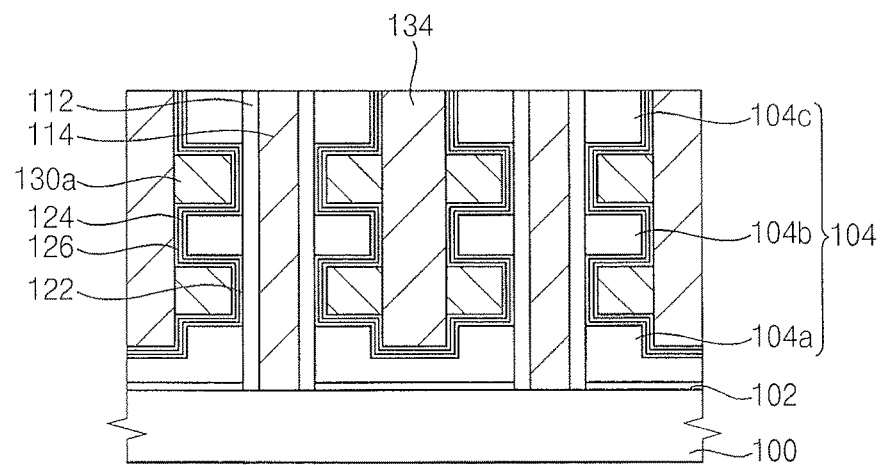
Figure 24:
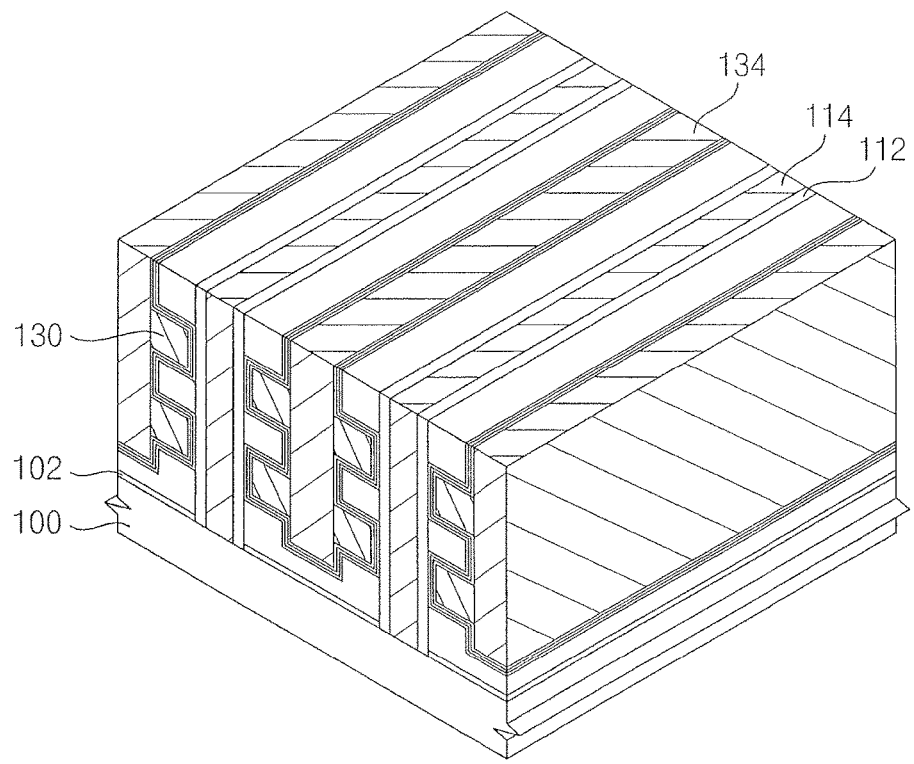

Referring to FIGS. 14 and 24, a silicon oxide layer is deposited in the third opening 132 and then the silicon oxide layer is planarized until the uppermost insulation interlayer 104c is exposed, to form a first silicon oxide layer pattern 134.

Alternatively, in a case where the capping layer is used as a hard mask in a previous process, the capping layer may be completely removed by the planarization process.

Figure 15A:
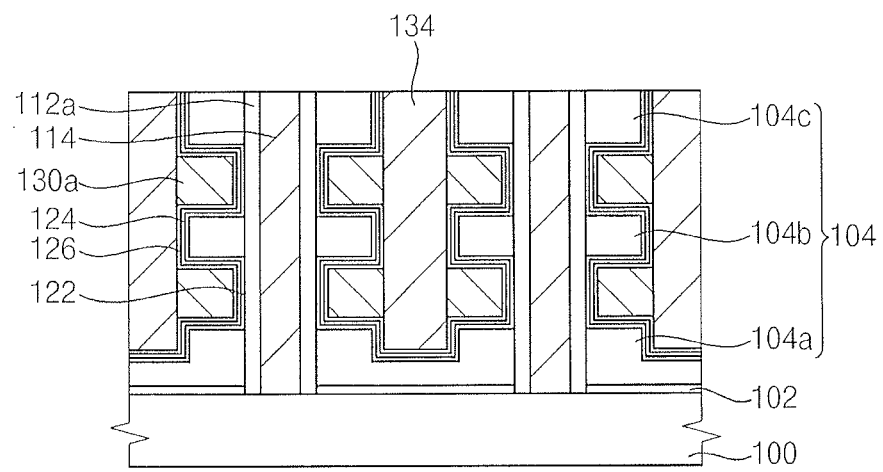
Figure 15B:
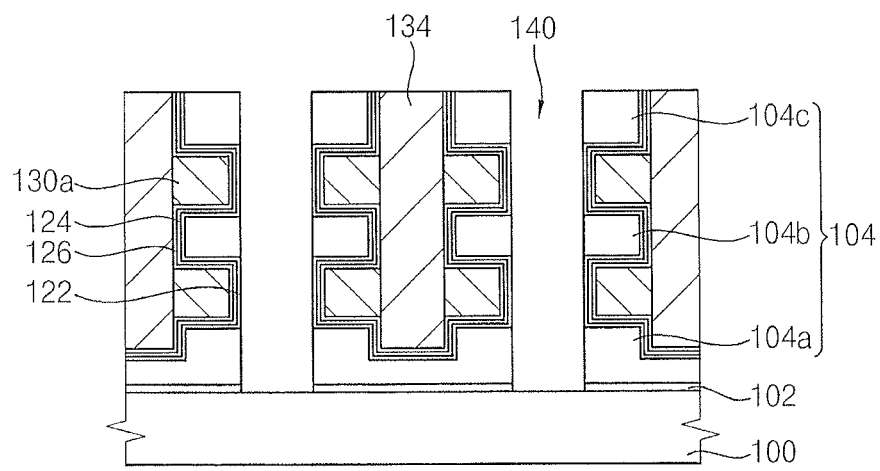
Figure 25:
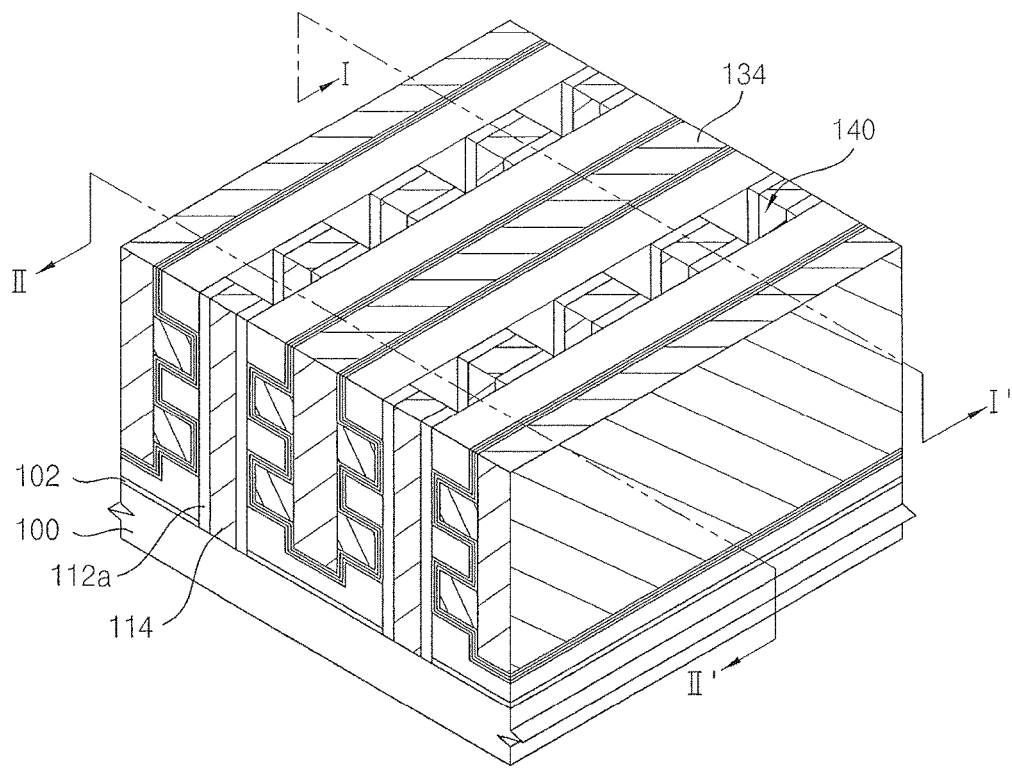

FIG. 15A is a cross-sectional view taken along a line I-I' in FIG. 25. FIG. 15B is a cross-sectional view taken along a line II-II' in FIG. 25.

Referring to FIGS. 15A, 15B and 25, a fourth photoresist pattern (not illustrated) having a contact-shaped opening is formed on upper surfaces of the uppermost insulation interlayer and the insulation layer pattern. The fourth photoresist pattern partially exposes the preliminary single-crystalline silicon pattern 112 and the insulation layer pattern 114.

The insulation layer pattern 114 and the preliminary single-crystalline silicon pattern 112 are partially etched using the fourth photoresist pattern as an etching mask until the surface of the substrate is exposed. By performing the etching process, a portion of the preliminary single-crystalline silicon pattern 112 is removed to form a single-crystalline semiconductor pattern 112a having an isolated shape on both the sidewalls of the insulation layer pattern 114. In one embodiment, the single-crystalline semiconductor pattern 112a can have a pillar shape.

The portion of the preliminary single-crystalline silicon pattern 112 of a bar type is anisotropically etched to form the single-crystalline semiconductor pattern 112a. The single-crystalline semiconductor pattern 112a may have a rectangular parallelepiped shape. The cell transistors are formed in the vertical direction on one sidewall of the single-crystalline semiconductor pattern 112a of the rectangular parallelepiped shape.

Figure 16A:
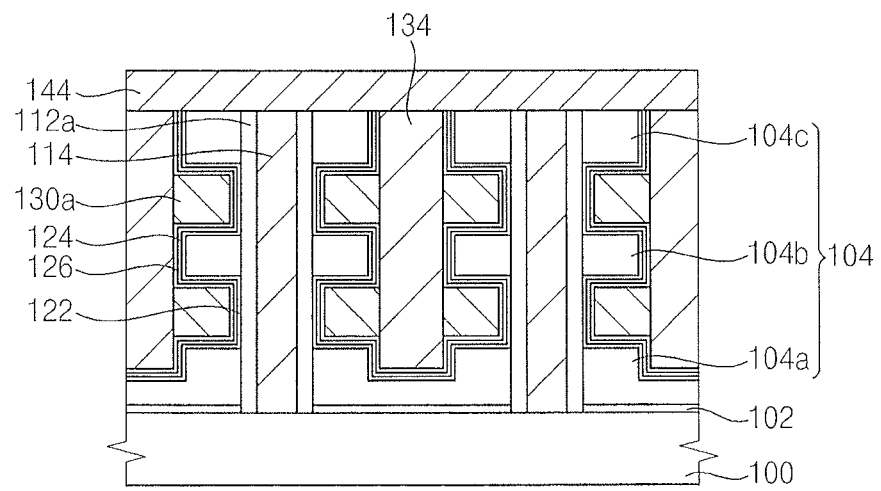
Figure 16B:
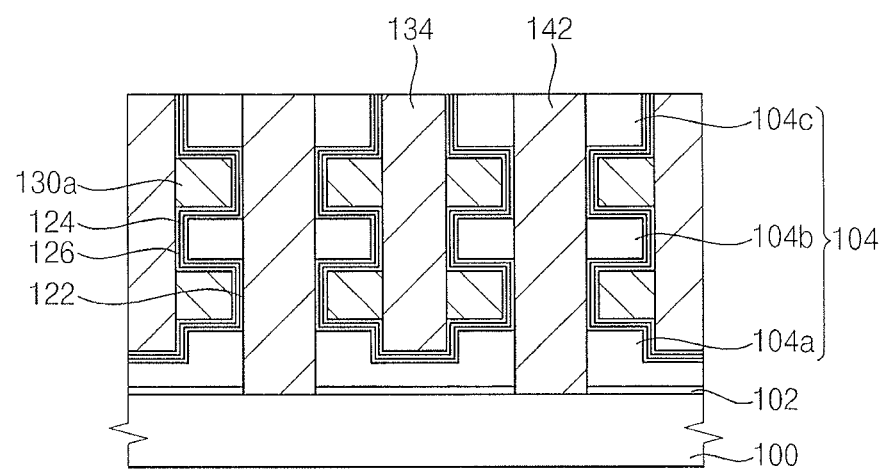
Figure 17:
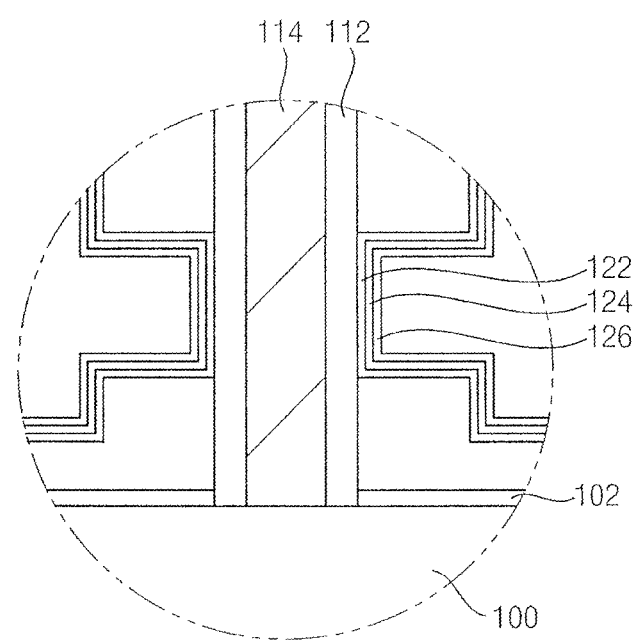
Figure 26:
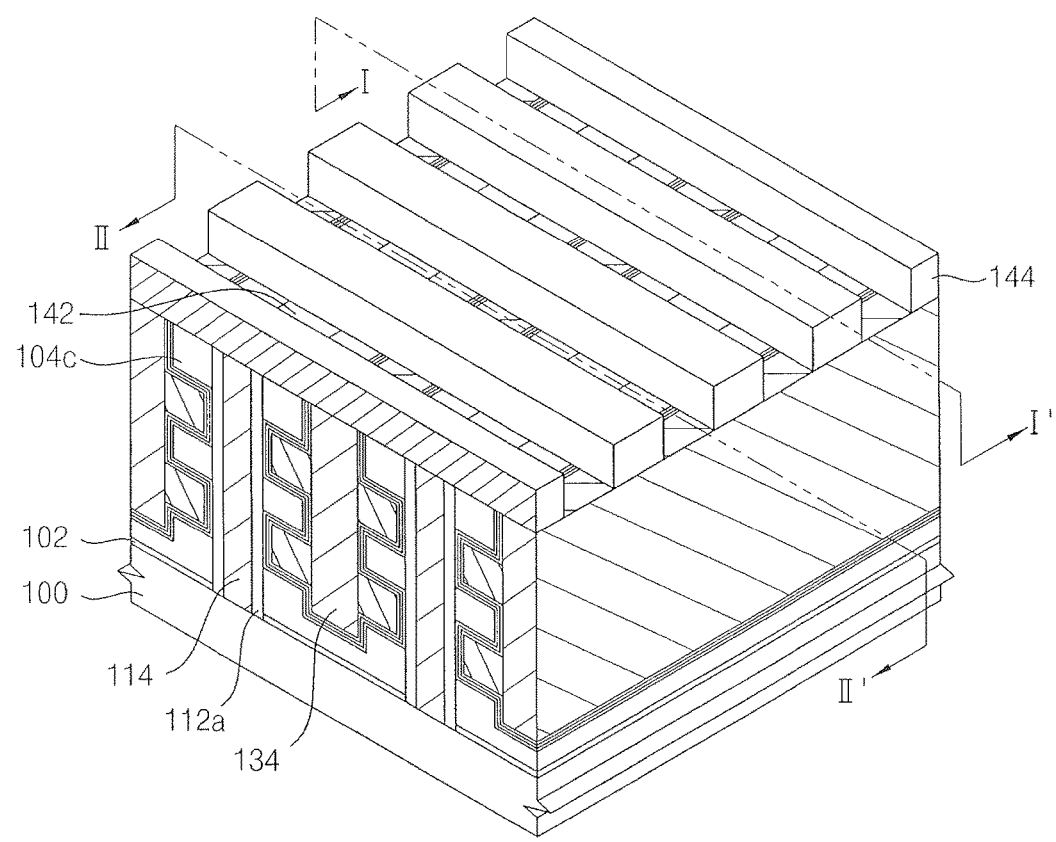

FIG. 16A is a cross-sectional view taken along a line I-I' in FIG. 26. FIG. 16B is a cross-sectional view taken along a line II-IF in FIG. 26.

Referring to FIGS. 16A, 16B and 26, a silicon oxide layer (not illustrated) is formed to cover the opening 140 that is formed by etching the portion of the insulation layer pattern 114. Then, the silicon oxide layer is planarized until the surface of the uppermost insulation interlayer is exposed, to form a second silicon oxide layer pattern 142.

By performing the planarization process, the upper surfaces of the uppermost insulation interlayer 104c, the single-crystalline semiconductor pattern 112a, the insulation layer pattern 114 and the second silicon oxide layer pattern 142 are exposed, and the surfaces thereof may become even.

A bit line is formed on the exposed single-crystalline semiconductor patterns 112a to connect the single-crystalline semiconductor patterns 112 that are spaced apart from one another and arranged repeatedly in the first direction.

As mentioned above, if the bit line is formed to make contact with a top portion of the exposed single-crystalline semiconductor patterns 112a, a process for forming a bit contact plug may not be required prior to forming the bit line, thereby simplifying a process of forming the bit line.

Alternatively, although not illustrated in the figures, a contact plug to be connected to the single-crystalline semiconductor pattern 112a may be formed, and then a bit line to connect the contact plugs to one another may be formed.

By the above-mentioned processes, a NAND-type non-volatile memory device including the cell transistors that are connected in series to one another in the vertical direction is formed. According to the above-mentioned embodiment, since a single-crystalline semiconductor pattern is formed using a silicon layer that is deposited on both sidewalls of a trench, the single-crystalline semiconductor pattern may have a very small width. Accordingly, the number of the single-crystalline semiconductor patterns to be formed in a volume with a narrow lateral dimension may be increased, and thus the degree of integration of the NAND-type non-volatile memory device may be enhanced.

Figure 27:
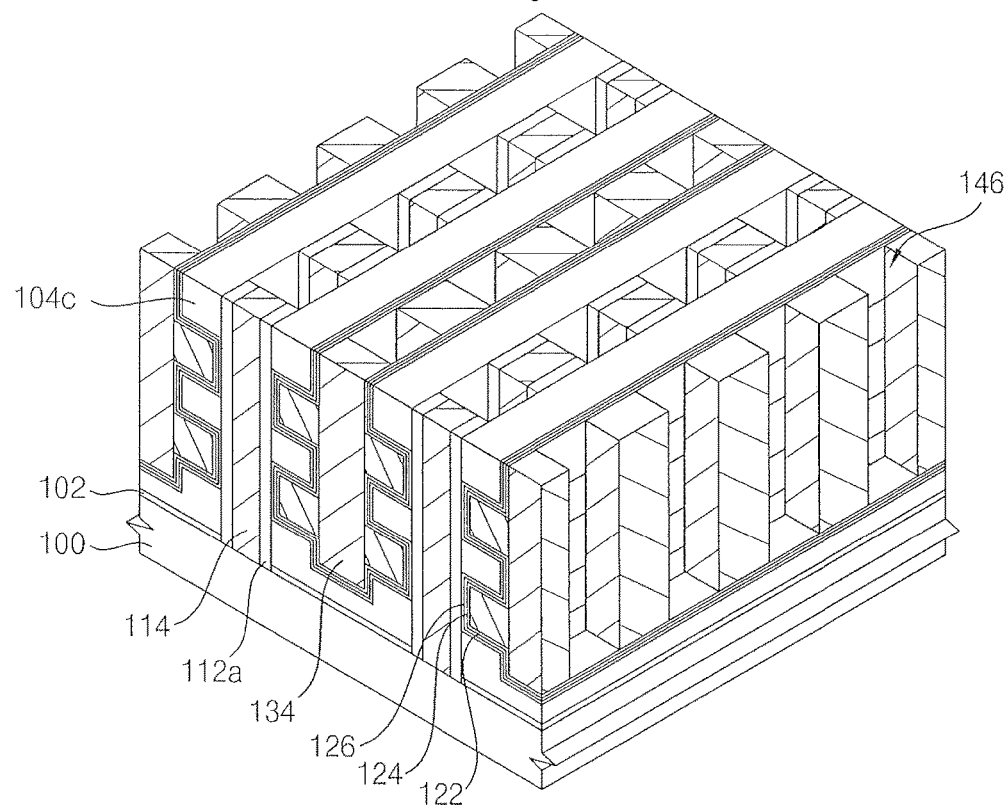
FIGS. 27 and 28 are perspective views illustrating another method of manufacturing a vertical-type non-volatile memory device according to the first example embodiment of FIG. 1.
Figure 28:
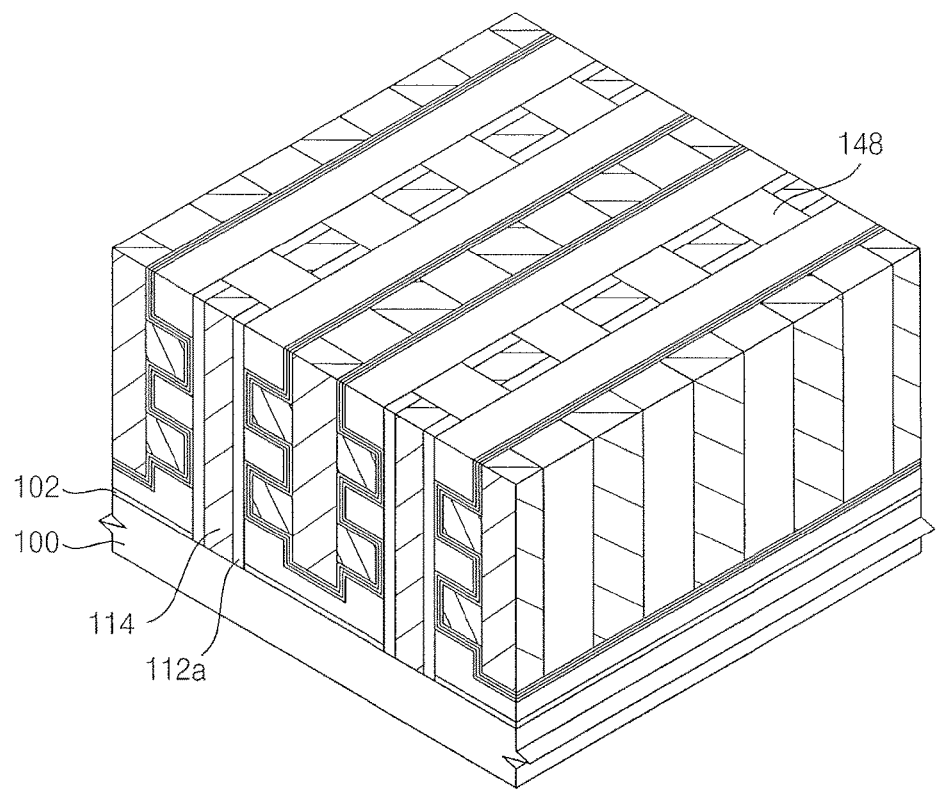

FIGS. 27 and 28 are perspective views illustrating another method of manufacturing a vertical-type non-volatile memory device according to the first example embodiment in FIG. 1. The present method to be mentioned hereinafter is substantially the same as the method explained with reference to FIGS. 3 to 16B, except for a process of etching a preliminary single-crystalline silicon pattern to form a single-crystalline semiconductor pattern.

First, the same processes as those explained with reference to FIGS. 3 to 14 are performed on the substrate 100 to form the insulation interlayer patterns 104, the insulation layer pattern 114, the preliminary single-crystalline silicon pattern 112, the tunnel oxide layer 122, the charge-trapping layer 124, the blocking dielectric layer 126, the control gate pattern 130a and the first silicon oxide layer pattern 134 as illustrated in FIG. 14.

Referring to FIG. 27, a photoresist pattern (not illustrated) having a linear shape extending in the second direction substantially perpendicular to the first direction is formed on the surfaces of the uppermost insulation interlayer 104c, the insulation layer pattern 114 and the first silicon oxide layer pattern 134.

The first silicon oxide layer pattern 134 and the insulation layer pattern 114 are selectively etched using the photoresist pattern as an etching mask until the substrate 100 is exposed. In the etching process, the insulation interlayer pattern 104 does not need to be removed.

The preliminary single-crystalline silicon pattern 112 is etched together to form a single-crystalline semiconductor pattern 112a. The single-crystalline semiconductor pattern 112a may have a pillar shape. The single-crystalline semiconductor pattern 112a is formed on both sidewalls of the insulation layer pattern 114.

Referring to FIG. 28, a silicon oxide layer (not illustrated) is deposited to fill an opening 146 that is formed by removing the first silicon oxide layer pattern 134 and the insulation layer pattern 114. Then, the silicon oxide layer is planarized until the upper surface of the uppermost insulation interlayer pattern 104c is exposed, to form a second silicon oxide layer pattern 148 that fills the opening 146.

By performing the planarization process, the upper surfaces of the uppermost insulation interlayer 104c, the single-crystalline semiconductor pattern 112a, the insulation layer pattern 114 and the second silicon oxide layer pattern 148 are exposed, and the surfaces thereof are made to be relatively even with each other.

Then, a bit line is formed on the exposed single-crystalline semiconductor patterns 112a to connect the single-crystalline semiconductor patterns 112 that are spaced apart from one another and arranged repeatedly in the first direction, and thus a vertical-type non-volatile memory device of the type illustrated in FIG. 1 is completed.

Figure 29:
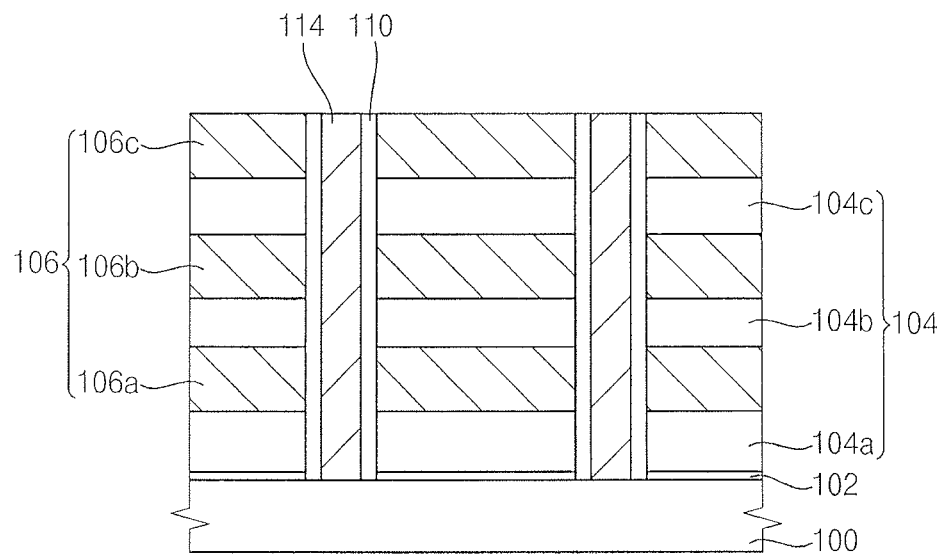
FIGS. 29 to 31 are cross-sectional views illustrating still another method of manufacturing a vertical-type non-volatile memory device according to the first example embodiment of FIG. 1.
Figure 30:
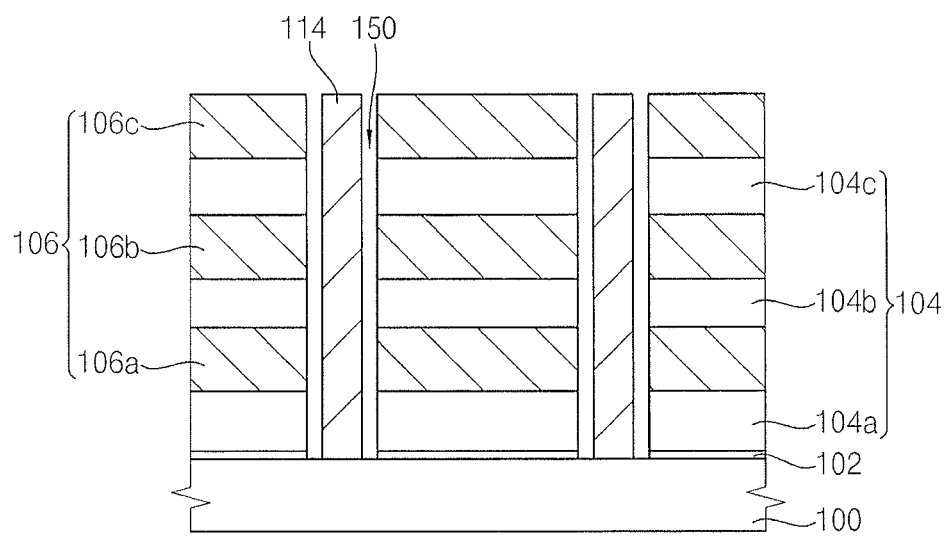
Figure 31:
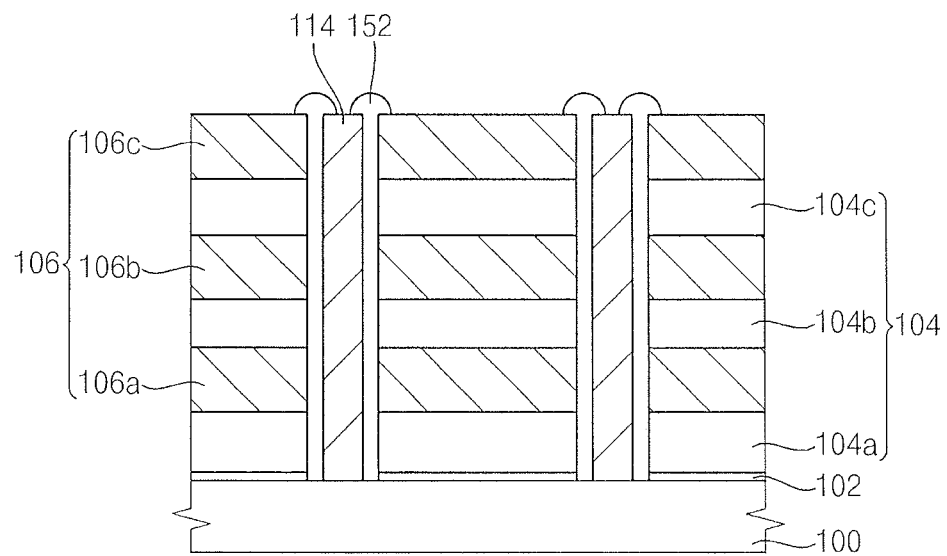

FIGS. 29 to 31 are cross-sectional views illustrating still another method of manufacturing a vertical-type non-volatile memory device according to the first example embodiment of FIG. 1.

Referring to FIG. 29, first, the same processes as those explained with reference to FIGS. 3 to 5 are performed on the substrate 100 to form the insulation layer structure including the first trench 108 and the amorphous silicon pattern 110 formed on both the sidewalls of the first trench 108 on the substrate 100. Alternatively, a polysilicon pattern may be formed on both sidewalls of the first trench 108, instead of the amorphous silicon pattern 110. The amorphous silicon pattern 110 or the polysilicon pattern may be removed by a subsequent process to be provided as a sacrificial layer for forming a fine trench.

Then, a silicon oxide layer (not illustrated) is formed to fill the first trench 108 where the amorphous silicon pattern 110 is formed. The silicon oxide layer is planarized until the upper surface of the amorphous silicon pattern 110 is exposed, to form an insulation layer pattern 114.

Referring to FIG. 30, the exposed amorphous silicon pattern 110 is removed to form a fine trench 150 between the insulation layer pattern 114 and the insulation layer structure. The single-crystalline silicon substrate is exposed through a bottom surface of the fine trench 150.

The amorphous silicon pattern 110 may be removed by a wet or dry etching process. However, in order to completely remove the amorphous silicon pattern 110 and to reduce damage to the surface of the substrate 1000, the amorphous silicon pattern 110 may be removed by a wet etching process.

The fine trench 150 defines a region where a preliminary single-crystalline silicon pattern is formed. Accordingly, as the thickness of the amorphous silicon pattern 110 is adjusted, the width of the preliminary single-crystalline silicon pattern may be adjusted.

Referring to FIG. 31, an epitaxial growth process using the surface of the substrate 100 that is exposed through the bottom surface of the fine trench 150 as a seed is performed to form a single-crystalline silicon layer 152 that completely fills the fine trench 150.

Then, the single-crystalline silicon layer 152 is planarized until the upper surface of the uppermost insulation interlayer is exposed, to form a preliminary single-crystalline silicon pattern 112, as illustrated in FIG. 7.

After forming the preliminary single-crystalline silicon pattern 112, the processes explained with reference to FIGS. 8 to 17 are performed to complete a non-volatile memory device.

Embodiment 2

Figure 32:
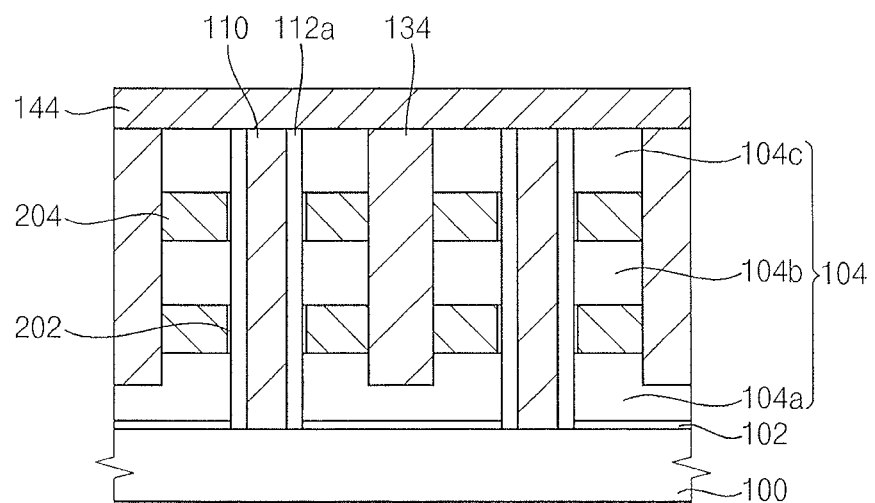
FIG. 32 is a cross-sectional view illustrating a vertical-type semiconductor device in accordance with a second example embodiment.

FIG. 32 is a cross-sectional view illustrating a vertical-type semiconductor device in accordance with a second example embodiment.

The semiconductor device of the present embodiment is substantially the same as Embodiment 1 except that a metal-oxide semiconductor (MOS) transistor is formed on a sidewall of a single-crystalline silicon pattern having a pillar shape. That is, the semiconductor device illustrated in FIG. 32 has a structure in which MOS transistors including a gate oxide layer 202 and a gate electrode 204 are connected in series to one another.

The method of forming a structure of FIG. 32 may be selected from any one of methods of manufacturing a memory device according to Embodiment 1. However, since the charge-trapping layer and the blocking dielectric layer are not required for the MOS transistor, there is only a difference that processes of forming the charge-trapping layer and the blocking dielectric layer are not performed. Thus, any further explanations thereof will be omitted.

Embodiment 3

Figure 33:
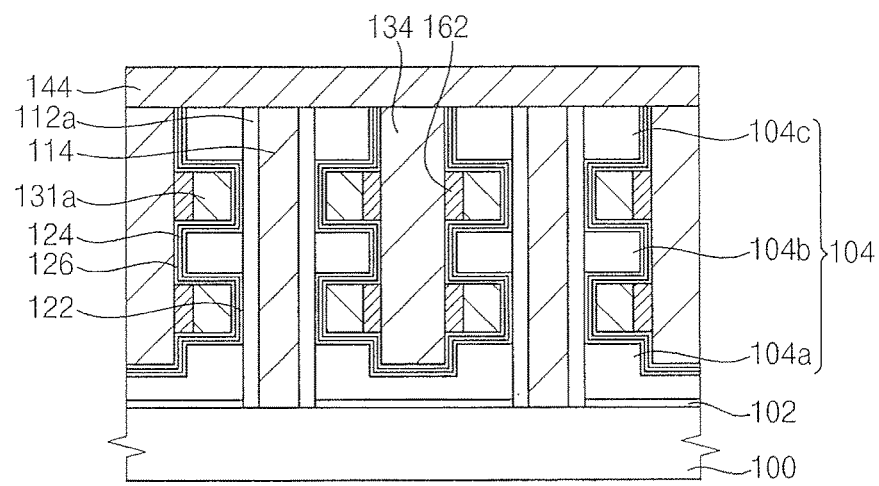
FIG. 33 is a cross-sectional view illustrating a non-volatile memory device in accordance with a third example embodiment.
Figure 34:
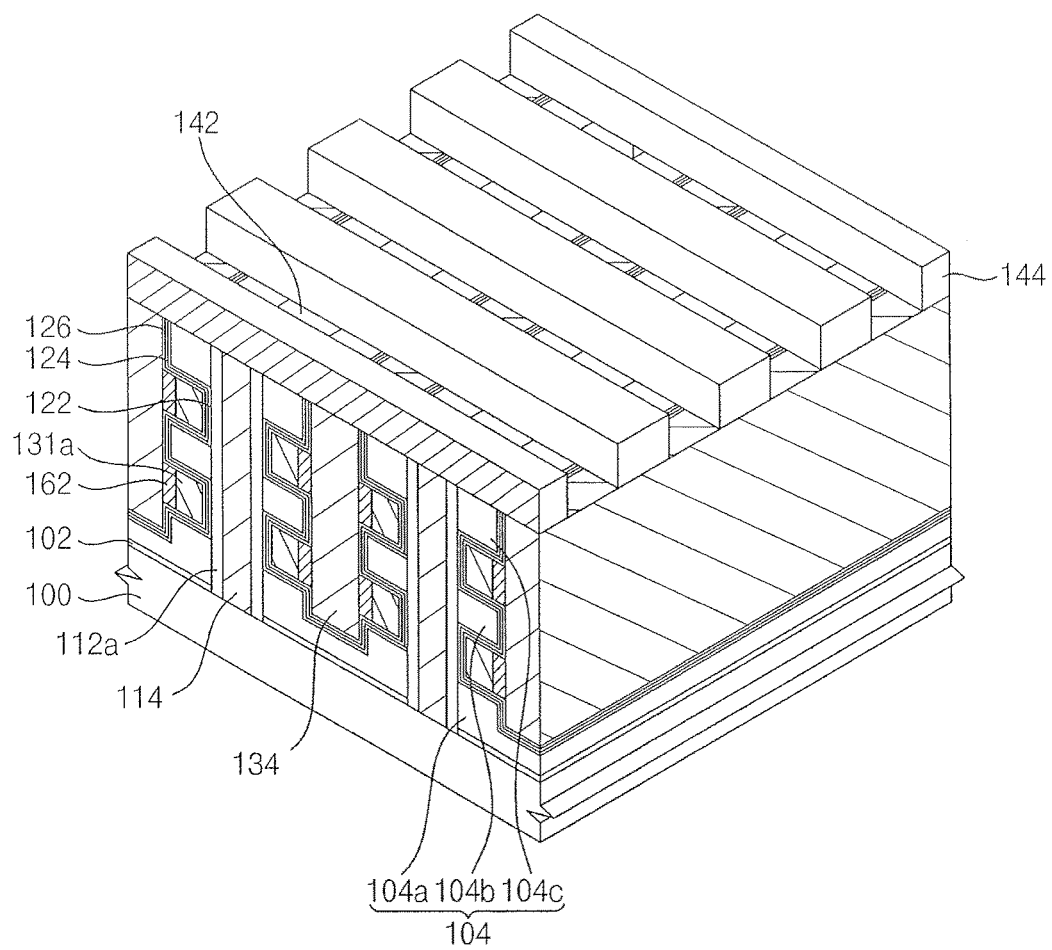
FIG. 34 is a perspective view illustrating the non-volatile memory device of FIG. 33.

FIG. 33 is a cross-sectional view illustrating a non-volatile memory device in accordance with a third example embodiment. FIG. 34 is a perspective view illustrating the non-volatile memory device of FIG. 33.

The non-volatile memory device of the present embodiment is substantially the same as Embodiment 1 except that a metal silicide pattern is formed on a surface of a control gate pattern in a non-volatile memory device. Thus, any further explanations with respect to the same elements will be omitted.

Referring to FIG. 33, the substrate 100 including a single-crystalline semiconductor material is provided. An impurity region is provided under the surface of the substrate 100 to be provided as a common source line.

The insulation layer pattern 114 is provided on the substrate 100 to have a linear shape extending in the first direction. The pillar-shaped single-crystalline semiconductor patterns 112*a* are provided on both the sidewalls of the insulation layer pattern 114. A plurality of the single-crystalline semiconductor patterns 112*a* are provided on both sidewalls of one insulation layer pattern 114. The single-crystalline semiconductor pattern 112*a* may have a rectangular parallelepiped shape. The entire surface of the first sidewall of the single-crystalline semiconductor pattern 112*a* makes contact with the insulation layer pattern 114.

For example, the single-crystalline semiconductor pattern 112*a* may include single-crystalline silicon. The single-crystalline silicon may be formed to undergo phase transition from amorphous silicon by a thermal treatment or an LEG process. Alternatively, the single-crystalline silicon may be formed by a SEG process using the substrate 100 as a seed.

The insulation interlayer patterns 104 are provided on the second sidewall of the single-crystalline semiconductor pattern 112*a* opposite to the first sidewall thereof. A plurality of the insulation interlayer patterns 104 are spaced apart from one another and arranged in the vertical direction. Each of the insulation interlayer patterns 104 may have a linear shape extending in the first direction. The structure of the insulation interlayer patterns 104 may be substantially the same as that explained with reference with FIG. 1.

The cell transistors are provided in gaps between the insulation interlayer patterns 104. Accordingly, the insulation interlayer patterns 104 may define a region where the cell transistor is formed. The insulation interlayer patterns 104 insulate the control gate patterns 130*a* lying in different layers from one another.

Next, the cell transistor will be further explained in detail.

The tunnel oxide layers 122 are provided on the second sidewall of the single-crystalline semiconductor pattern 112*a*. The tunnel oxide layers 122 make contact with portions of the second sidewall of the single-crystalline semiconductor pattern 112*a*. The tunnel oxide layers 122 are spaced apart from one another in the vertical direction by a predetermined distance, without making contact with the entire second sidewall. The surface of the single-crystalline pattern 112*a* may be thermally oxidized to form the tunnel oxide layer 122.

The charge-trapping layers 124 are provided on the tunnel oxide layer 122. The charge-trapping layer 124 may include silicon nitride or metal oxide that is capable of trapping electric charges.

The blocking dielectric layer 126 is provided on the charge-trapping layer 124. The blocking dielectric layer 12 may include silicon oxide or metal oxide. Here, the metal oxide may have a higher dielectric constant than the silicon nitride.

The charge-trapping layer 124 and the blocking dielectric layer 126 face the second sidewall of the single-crystalline semiconductor pattern and the upper surfaces and the bottom surfaces of the insulation interlayer pattern 104.

The control gate patterns 130*a* are provided in the gap between the insulation interlayer patterns on the surface of the blocking dielectric layer 126. Upper and lower surfaces and a sidewall of the control gate pattern 130*a* make contact with the blocking dielectric layer 126. The control gate pattern 130*a* may include polysilicon. The control gate patterns 130*a* face the single-crystalline semiconductor pattern 112*a*.

The control gate patterns 130*a* in the same layer arranged in the first direction may be electrically connected to one another. The control gate pattern 130*a* in the same layer arranged in the first direction may have a linear shape. On the other hand, the control gate patterns 130*a* in different layers are insulated by the insulation interlayer patterns 104.

A metal silicide pattern 162 is provided in a gap between the insulation interlayer patterns 104 to make contact with the surface of the control gate pattern 131*a*. The metal silicide pattern 162 faces the single-crystalline semiconductor patterns 112*a*. The metal silicide patterns 162 in the same layer arranged in the first direction may be electrically connected to one another. The metal silicide patterns 162 in the same layer arranged in the first direction may have a linear shape. On the other hand, the metal silicide patterns 162 in different layers are insulated by the insulation interlayer patterns 104. Accordingly, the metal silicide pattern 162 may be provided as a word line.

The metal silicide pattern 162 may include cobalt silicide, nickel silicide, tungsten silicide, etc. These may be used alone or in a combination thereof. For example, the metal silicide may include cobalt silicide or nickel silicide.

As mentioned above, the cell transistor include the tunnel oxide layer 122, the charge-trapping layer 124, the blocking dielectric layer 126, the control gate pattern 130*a* and the metal silicide pattern 162 laterally formed on the sidewall of the single-crystalline semiconductor pattern 112*a*. A plurality of the cell transistors are arranged in one single-crystalline semiconductor pattern 112*a* and spaced apart from one another by the insulation interlayer pattern 104.

The silicon oxide layer pattern 134 is provided between the insulation interlayer patterns 104 and the control gate patterns 130*a*. The silicon oxide layer pattern 134 faces the insulation layer pattern 114.

The bit line 144 is provided on the upper surfaces of the single-crystalline semiconductor patterns 112*a* to electrically connect the single-crystalline semiconductor patterns 112*a* arranged in the first direction.

Although not illustrated in the figures, in this embodiment, upper and lower select transistors including a gate insulation layer pattern and a gate electrode may be provided on each of the uppermost and lowermost sidewalls of the single-crystalline semiconductor pattern 112*a*.

A non-volatile memory device according to this embodiment includes the metal silicide pattern having a low resistance on the surface of the control gate pattern. As the metal silicide pattern having a low resistance is formed on the surface of the control gate pattern to be used commonly for a word line, the operating speed of the non-volatile memory device may be increased.

FIGS. 35 to 40 are cross-sectional views illustrating a method of manufacturing a non-volatile memory device in accordance with a third example embodiment.

The method of manufacturing a non-volatile memory device as mentioned hereinafter is substantially the same as that of Embodiment 1, except that a process of forming a metal silicide pattern on a surface of the control gate pattern of a non-volatile memory device is additionally performed. Thus, any further explanations with respect to the same processes will be omitted.

The processes explained with reference to FIGS. 3 to 11 are performed on the substrate 100 to form a structure illustrated in FIG. 11. As illustrated in FIG. 11, the tunnel oxide layer 122, the charge-trapping layer 24 and the blocking dielectric layer 126 are formed on the surfaces of the sidewalls of the preliminary single-crystalline silicon pattern 112, the insulation interlayer patterns 104 and the capping layer 116.

Figure 35:
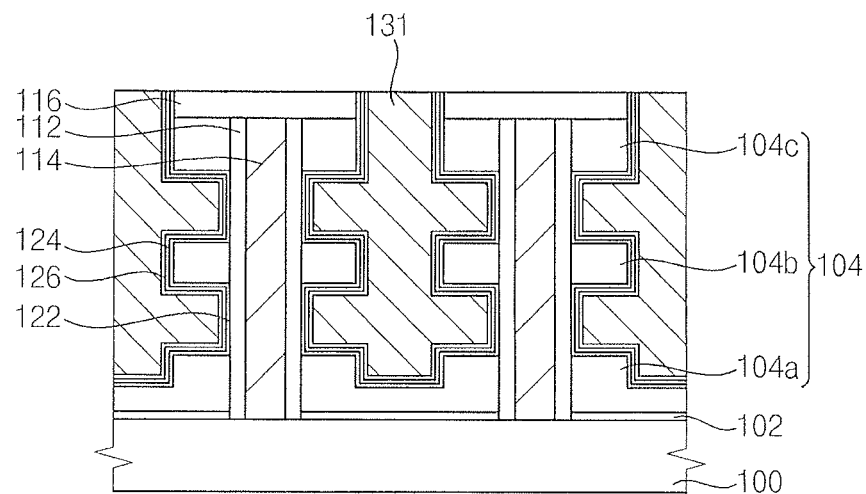
FIGS. 35 to 40 are cross-sectional views illustrating a method of manufacturing a non-volatile memory device in accordance with a third example embodiment.

Referring to FIG. 35, a polysilicon layer (not illustrated) is formed on the blocking dielectric layer 126 to fill the first and second openings 118 and 120. The polysilicon layer is provided as a control gate pattern through a following process.

After depositing the polysilicon layer, the polysilicon layer is planarized until an upper surface of the capping layer is exposed, to form a conductive layer pattern 131 including polysilicon in the first and second openings 118 and 120.

In this embodiment, in the process of forming the conductive layer pattern 131, the capping layer 116 may not be removed to remain. However, the tunnel oxide layer 122, the charge-trapping layer 124 and the blocking dielectric layer 126 formed on the capping layer 126 may optionally be removed by the planarization process. However, in an alternative embodiment, the tunnel oxide layer 122, the charge-trapping layer 124 and the blocking dielectric layer 126 on the capping layer 126 need not necessarily be removed.

Figure 36:
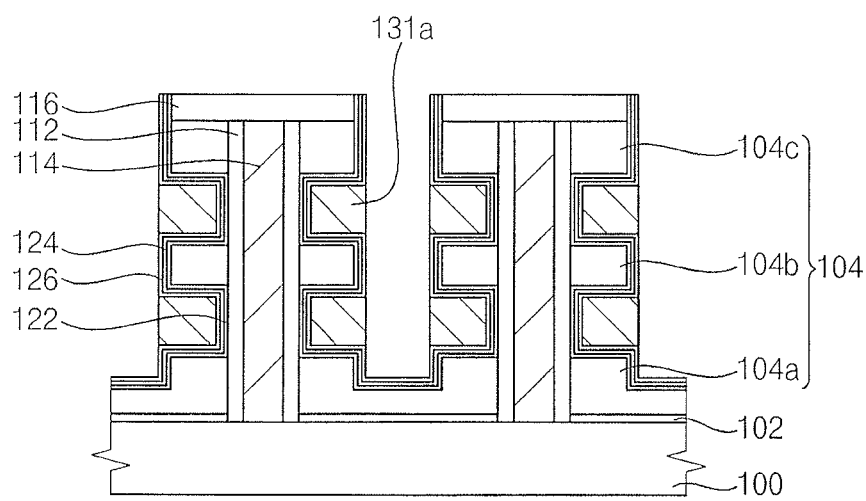

Referring to FIG. 36, a third photoresist pattern (not illustrated) is formed to selectively expose an upper surface of the conductive layer pattern 131. The exposed conductive layer pattern 131 is anisotropically etched using the third photoresist pattern as an etching mask to form a third opening 132 that separates the conductive layer patterns 131 in each of the layers apart from one another in the vertical direction.

By the above-mentioned process, control gate patterns 131a are formed between each of the layers of the insulation interlayer 104. The control gate pattern 131a in each of the layers may have a linear shape extending in the first direction. The control gate patterns 131a in the same layer may not be connected to one another and may not surround the preliminary single-crystalline silicon pattern 112. The control gate patterns 131a in the different layers may be insulated from one another.

As explained with reference to FIG. 13, in a process of forming the third opening 132, the blocking dielectric layer 126, the charge-trapping layer 126 and the tunnel oxide layer on the sidewalls of the first opening may be etched together with the conductive layer pattern 131. Alternatively, as illustrated in the figure, in a process of forming the third opening 132, the blocking dielectric layer 126, the charge-trapping layer 124 and the tunnel oxide layer on the sidewalls of the first opening may not be etched to remain.

Figure 37:
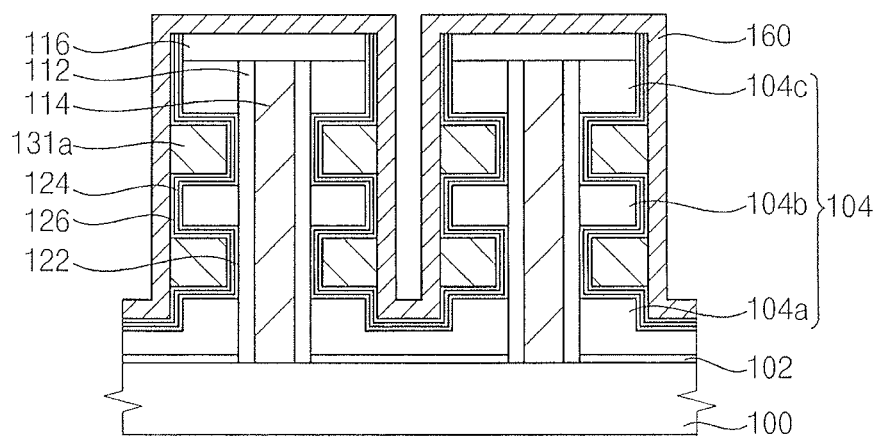

Referring to FIG. 37, a metal layer 160 is conformally deposited on sidewalls and a bottom surface of the third opening 132 and the upper surface of the capping layer. The metal layer may have a thickness less than half of the width of the third opening 132 to not completely fill the third opening 132.

The metal layer 160 may be deposited using a material that reacts with polysilicon of the control gate pattern 131a to form a metal silicide material. Examples of the material include cobalt, nickel, tungsten, palladium, etc. These may be used alone or in a combination thereof.

The metal layer may be formed by a CVD process or an atomic layer deposition (ALD) process having excellent step coverage. Alternatively, the metal layer may be formed by a physical vapor deposition (PVD) process.

The metal layer 160 makes contact with the surface of the control gate pattern 131. On the other hand, because the upper surface of the preliminary single-crystalline silicon pattern 112 is covered with the capping layer 116, the metal layer 160 need not necessarily make contact with the preliminary single-crystalline silicon pattern 112.

Figure 38:
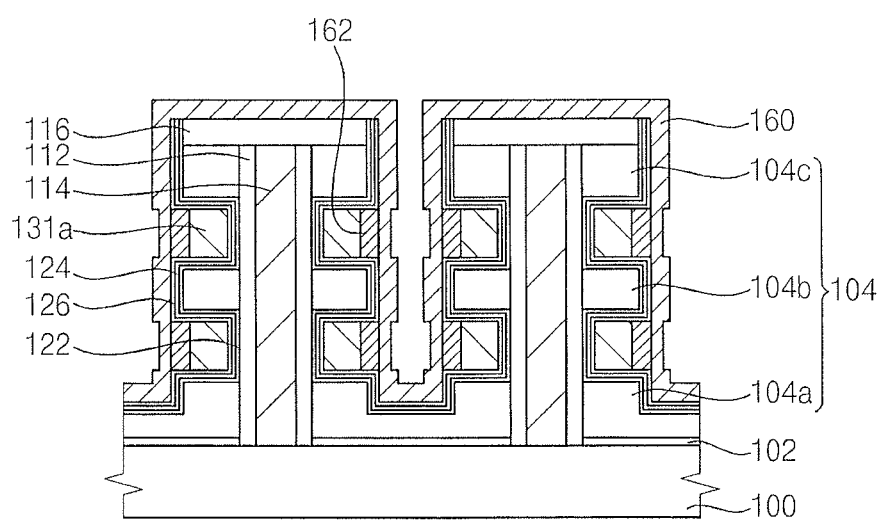

Referring to FIG. 38, the metal layer 160 is thermally treated to react a contact region of the metal layer 160 and the control gate pattern 131a including polysilicon. By the thermal treatment, a metal silicide pattern 162 is formed on the control gate pattern 131a. The thermal treatment may include a rapid thermal annealing (RTA) process. Alternatively, the thermal treatment may be performed using a furnace. The thermal treatment may be performed once, or twice or more at different temperatures.

By the thermal treatment, the thickness of the control gate pattern 131a may be reduced due to the reaction with polysilicon. The reaction process may be performed such that the control gate pattern 131a including polysilicon is not completely consumed and at least a portion thereof remains on the control gate pattern 131a. Accordingly, the control gate pattern 131a partially fills the gap between the insulation interlayer patterns 104.

The metal silicide pattern 162 may include cobalt silicide, nickel silicide, tungsten silicide, palladium silicide, etc. according to the material of the metal layer 160 that is deposited by the previous process.

When the metal layer includes cobalt or nickel, expansion of the metal silicide pattern 162 by the reaction minimally occurs. Further, because cobalt or nickel penetrates the control gate pattern 131a and reacts with polysilicon, the metal silicide pattern 162 minimally protrudes laterally therefrom. Thus, preferably, the metal silicon pattern 162 may include cobalt silicide or nickel silicide.

Figure 39:
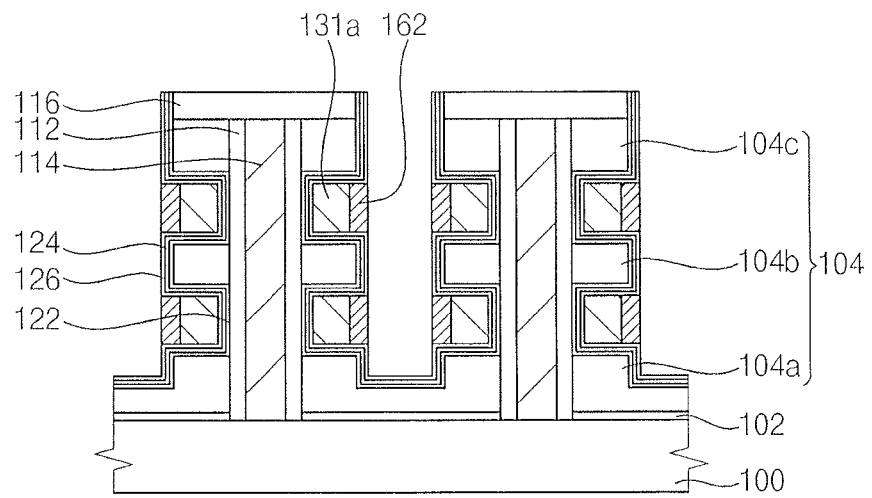

Referring to FIG. 39, the unreacted metal layer 160 is removed from the substrate 100. The unreacted metal layer 160 may be removed by an isotropic etching process.

By the removal process, the tunnel oxide layer 122, the charge-trapping layer 124, the blocking dielectric layer 126, the control gate pattern 131a and the metal silicide pattern 162 is formed laterally on the second sidewall of the preliminary single-crystalline silicon pattern 112.

After removing the metal layer, an additional thermal treatment process may be further performed to form a stable metal silicide having a low resistance.

Figure 40:
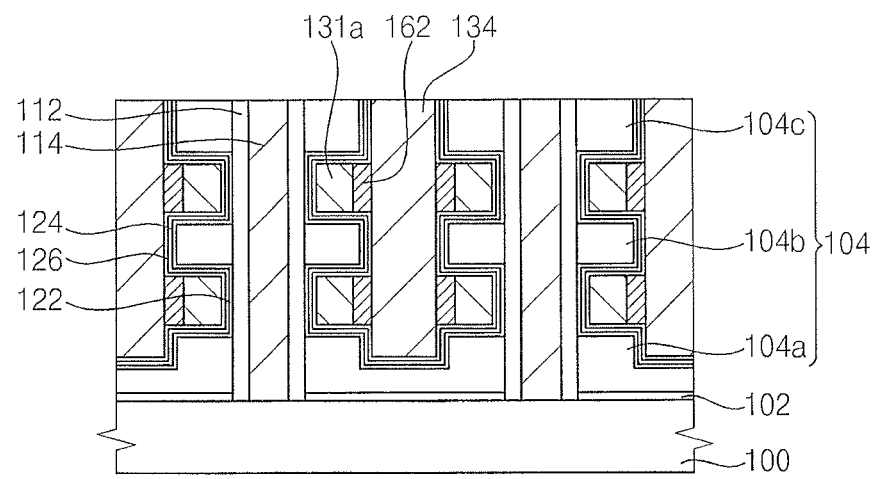

Referring to FIG. 40, a silicon oxide layer is deposited in the third opening 132. The silicon oxide layer is planarized until the uppermost insulation interlayer 104c is exposed, to form a first silicon oxide layer pattern 134. In the planarization process, the capping layer 116 is removed from the substrate 100.

Then, the processes explained with reference to FIGS. 15A to 16B are performed to form the single-crystalline semiconductor pattern 112a having a rectangular parallelepiped shape, and the tunnel oxide layer 122, the charge-trapping layer 124, the blocking layer dielectric layer 126, the control gate pattern 131a and the metal silicide pattern 162 formed laterally on the single-crystalline semiconductor pattern 112a. Then, the bit line 144 is formed to be connected to the single-crystalline semiconductor pattern 112a.

Thus, a non-volatile memory device illustrated in FIG. 33 is completed.

Alternatively, the processes explained with reference to FIGS. 27 and 28 may be performed to form a vertical-type non-volatile memory device, and a process of forming a metal silicide pattern on the surface of the control gate pattern may be further performed.

Alternatively, the processes explained with reference to FIGS. 29 to 31 may be performed to form a vertical-type non-volatile memory device, and a process of forming a metal silicide pattern on the surface of the control gate pattern may be further performed.

Embodiment 4

Figure 41:
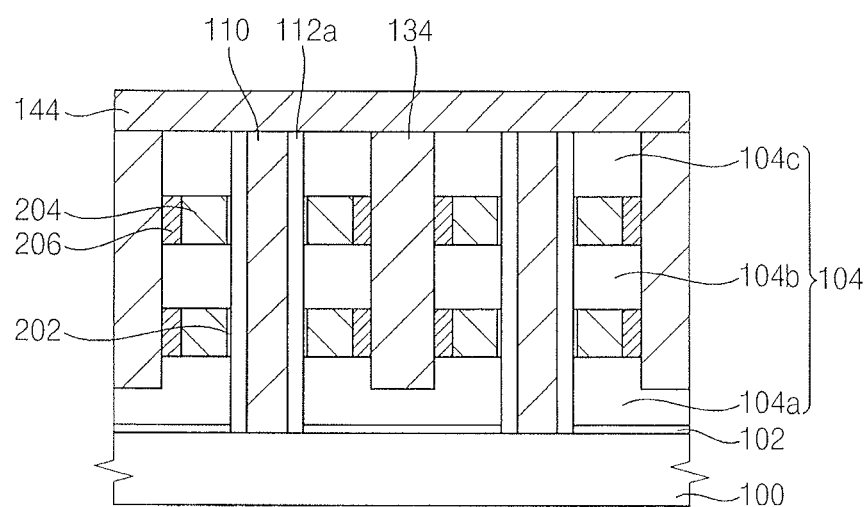
FIG. 41 is a cross-sectional view illustrating a vertical-type semiconductor memory device in accordance with a fourth example embodiment.

FIG. 41 is a cross-sectional view illustrating a vertical-type semiconductor memory device in accordance with a fourth example embodiment.

The semiconductor device of the present embodiment is substantially the same as Embodiment 3 except for a MOS transistor formed on a sidewall of a single-crystalline silicon pattern having a pillar shape. That is, the semiconductor device illustrated in FIG. 41 has a structure in which MOS transistors including a gate oxide layer 202 and a gate electrode 204 are connected in series to one another. Further, a metal silicide pattern 206 is provided on a surface of the gate electrode in the semiconductor device.

The method of forming a structure of FIG. 41 may be selected from any one of methods of manufacturing a memory device according to Embodiment 3. However, since the charge-trapping layer and the blocking dielectric layer are not required for the MOS transistor, there is only a difference that processes of forming the charge-trapping layer and the blocking dielectric layer are not performed. Thus, any further explanations thereof will be omitted.

As mentioned above, according to example embodiments, two single-crystalline semiconductor patterns having pillar shapes are provided within a trench to be formed by a photolithography process. Therefore, a highly integrated semiconductor device may be using the single-crystalline silicon patterns. According to example embodiments, various semiconductor devices may be formed in a vertical direction to a substrate using the single-crystalline silicon patterns.

The foregoing is illustrative of example embodiments and is to not be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is to not be construed as limited to the specific example embodiments disclosed, and that modifications to the disclosed example embodiments, as well as other example embodiments, are intended to be included within the scope of the appended claims.

What is claimed is:

1. A method of manufacturing a vertical non-volatile memory device, comprising:
repeatedly and alternatingly stacking insulation layers and sacrificial gate layers on a substrate to form a stacked structure;
forming a first, trench in the stacked structure, the first trench penetrating the insulation layers and sacrificial gate layers and exposing a portion of the substrate;
forming a semiconductor channel pattern in the first trench;
forming a second trench in the stacked structure adjacent the first trench, the second trench penetrating the sacrificial gate layers;
removing the sacrificial gate layers to expose a sidewall of the semiconductor channel pattern;
forming a dielectric layer in the second trench on the expose sidewall of the semiconductor channel pattern; and
forming a control gate pattern on the dielectric layer opposite the sidewall of the semiconductor channel pattern.

2. The method of claim 1, wherein the insulation layers comprise a first insulation layer in direct contact with the substrate.

3. The method of claim 1, wherein the semiconductor channel pattern comprises a single-crystalline channel pattern.

4. The method of claim 1, wherein the dielectric layer comprises a metal oxide.

5. The method of claim 1, wherein the control gate pattern is formed adjacent a first one of the insulation layers; and
wherein the dielectric layer extends between the control gate pattern and the first one of the insulation layers adjacent the control gate pattern.

6. The method of claim 1, wherein forming the semiconductor channel pattern in the first trench comprises forming a pair of semiconductor channel patterns on opposing sidewalls of the first trench; and
wherein forming the second trench comprises forming a pair of second trenches on opposite sides of the first trench.

7. The method of claim 6, further comprising:
forming an insulting pattern in the first trench between the pair of semiconductor channel patterns.

8. The method of claim 1, further comprising:
forming a charge trapping layer between the dielectric layer and the semiconductor channel pattern.

9. The method of claim 8, further comprising:
forming a tunnel dielectric layer between the charge trapping layer and the semiconductor channel pattern.

10. A method of manufacturing a vertical non-volatile memory device, comprising:
forming a first insulation layer on a substrate;
forming a sacrificial layer on the first insulation layer;
forming a second insulation layer on the first insulation layer;
forming a first trench penetrating the first and second insulation layers and the sacrificial layer and exposing a portion of the substrate;
forming a single-crystalline semiconductor channel pattern in the first trench;
forming a second trench adjacent the first trench, the second trench penetrating the second insulation layer and the sacrificial layer;
removing the sacrificial layer to expose a sidewall of the single-crystalline semiconductor channel pattern;
forming an oxide layer on the sidewall of the single-crystalline semiconductor channel pattern;
forming a blocking dielectric layer in the second trench on the oxide layer, wherein the blocking dielectric layer comprises a metal oxide, and wherein the blocking dielectric layer extends onto the first and second insulation layers; and
forming a control gate in the second trench, wherein the blocking dielectric layer is between the control gate and the single-crystalline semiconductor channel pattern and between the control gate and the first and second insulation layers.

11. The method of claim 10, wherein the blocking, dielectric layer extends down a sidewall of the second trench.

12. The method of claim 10, wherein the second trench extends into the first insulation layer and does not expose the substrate beneath the second trench.

13. The method of claim 10, wherein the blocking dielectric layer extends onto a floor of the second trench.

14. The method of claim 10, wherein forming the single-crystalline semiconductor channel pattern in the first trench comprises forming a pair of single-crystalline semiconductor channel patterns on opposing sidewalls of the first trench.

15. The method of claim 14, further comprising:
forming an insulting pattern in the first trench between the pair of single-crystalline semiconductor channel patterns.

16. A method of manufacturing a vertical non-volatile memory device, comprising:
forming a pad oxide layer on a substrate;
forming a stacked structure on the pad oxide layer, the stacked structure including a first insulation layer on the pad oxide layer, a sacrificial layer on the first insulation layer, and a second insulation layer on the first insulation layer, wherein the first insulation layer is between the sacrificial layer and the pad oxide layer;
forming a first trench in the stacked structure, the first trench penetrating the first and second insulation layers, the sacrificial layer and the pad oxide layer and exposing a portion of the substrate;
forming a semiconductor channel pattern in the first trench;
forming a second trench adjacent the first trench, the second trench penetrating the second insulation layer and the sacrificial layer;
removing the sacrificial layer to expose a sidewall of the semiconductor channel pattern;
forming a blocking dielectric layer in the second trench on the sidewall of the semiconductor channel pattern, wherein the blocking dielectric layer comprises, a metal oxide, and wherein the blocking dielectric layer extends onto the first and second insulation layers; and
forming a control gate in the second trench, wherein the blocking dielectric layer is between the control gate and the semiconductor channel pattern and between the control gate and the first and second insulation layers.

* * * * *